United States Patent
Nakazawa

(10) Patent No.: US 8,853,009 B2
(45) Date of Patent: Oct. 7, 2014

(54) METHOD FOR MANUFACTURING REVERSE-BLOCKING SEMICONDUCTOR ELEMENT

(75) Inventor: Haruo Nakazawa, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/980,048

(22) PCT Filed: Jan. 16, 2012

(86) PCT No.: PCT/JP2012/050760
§ 371 (c)(1),
(2), (4) Date: Jul. 16, 2013

(87) PCT Pub. No.: WO2012/099080
PCT Pub. Date: Jul. 26, 2012

(65) Prior Publication Data
US 2013/0295729 A1    Nov. 7, 2013

(30) Foreign Application Priority Data
Jan. 18, 2011    (JP) ................. 2011-007801

(51) Int. Cl.
| | |
|---|---|
| H01L 21/332 | (2006.01) |
| H01L 21/762 | (2006.01) |
| H01L 29/66 | (2006.01) |
| H01L 29/739 | (2006.01) |
| H01L 21/268 | (2006.01) |
| H01L 21/265 | (2006.01) |
| H01L 29/36 | (2006.01) |
| H01L 21/324 | (2006.01) |
| H01L 29/06 | (2006.01) |

(52) U.S. Cl.
CPC .... *H01L 29/66325* (2013.01); *H01L 21/76237* (2013.01); *H01L 29/7395* (2013.01); *H01L 21/268* (2013.01); *H01L 21/26586* (2013.01); *H01L 21/26513* (2013.01); *H01L 29/36* (2013.01); *H01L 21/324* (2013.01); *H01L 29/0661* (2013.01)
USPC .................... 438/135; 438/369; 257/E21.382

(58) Field of Classification Search
USPC .......... 438/342, 354, 378, 405; 257/E21.382, 257/E21.385, E21.4
See application file for complete search history.

(56) References Cited

U.S. PATENT DOCUMENTS

| | | |
|---|---|---|
| 4,904,609 A | 2/1990 | Temple |
| 2006/0038206 A1 | 2/2006 | Shimoyama et al. |
| 2008/0227277 A1 | 9/2008 | Nakazawa |
| 2010/0173476 A1 | 7/2010 | Nakazawa |

FOREIGN PATENT DOCUMENTS

| | | |
|---|---|---|
| JP | H02-22869 A | 1/1990 |
| JP | 2001-185727 A | 7/2001 |

(Continued)

*Primary Examiner* — Cheung Lee
(74) *Attorney, Agent, or Firm* — Rabin & Berdo, PC

(57) ABSTRACT

In a method of manufacturing a reverse-blocking semiconductor element, a tapered groove is formed and ions are implanted into a rear surface and the tapered groove. Then, a furnace annealing process and a laser annealing process are performed to form a rear collector layer and a separation layer on the side surface of the tapered groove. In this way, it is possible to ensure a reverse breakdown voltage and reduce a leakage current when a reverse bias applied, even in a manufacturing method including a process of manufacturing a diffusion layer formed by forming a tapered groove and performing ion implantation and an annealing process for the side surface of the tapered groove as the separation layer for bending the termination of a reverse breakdown voltage pn junction to extend to the surface.

13 Claims, 19 Drawing Sheets

(56) References Cited

FOREIGN PATENT DOCUMENTS

| | | |
|---|---|---|
| JP | 2002-076017 A | 3/2002 |
| JP | 2003-059856 A | 2/2003 |
| JP | 2004-336008 A | 11/2004 |
| JP | 2005-268487 A | 9/2005 |
| JP | 2006-156926 A | 6/2006 |
| JP | 2006-303410 A | 11/2006 |
| JP | 2008-244446 A | 10/2008 |
| JP | 2010-141136 A | 6/2010 |
| JP | 2010-212530 A | 9/2010 |

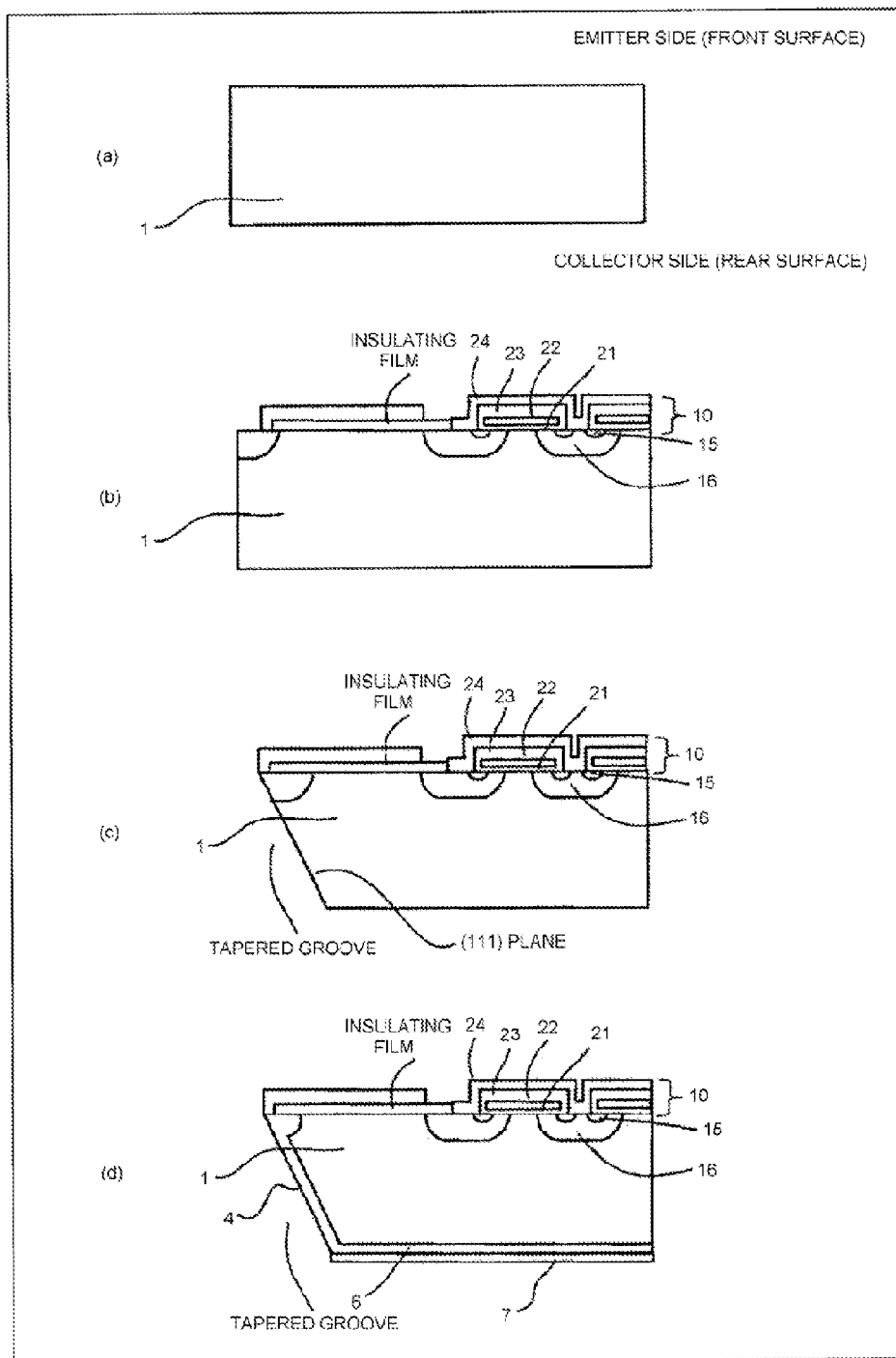

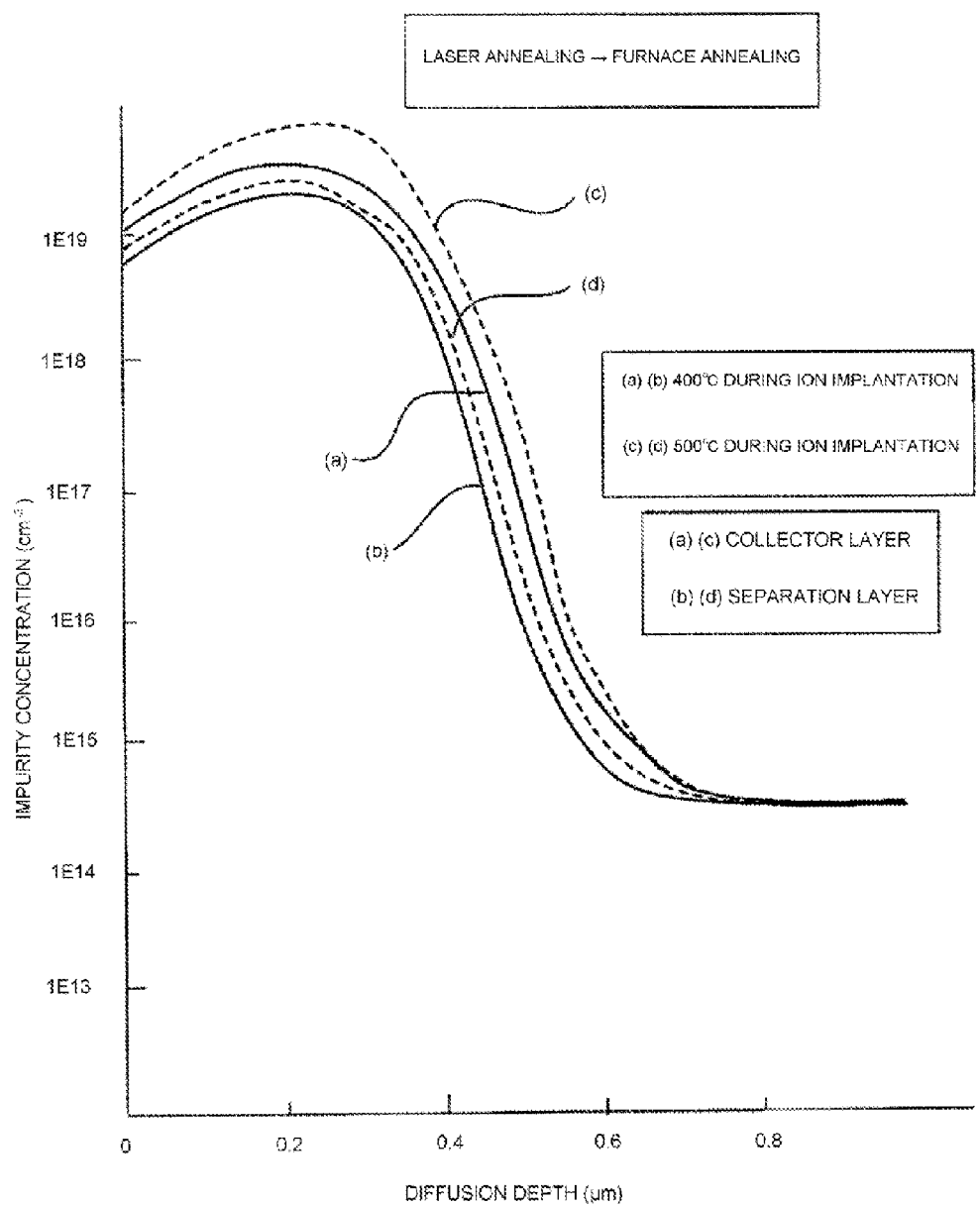

FIG. 6 RELATED ART
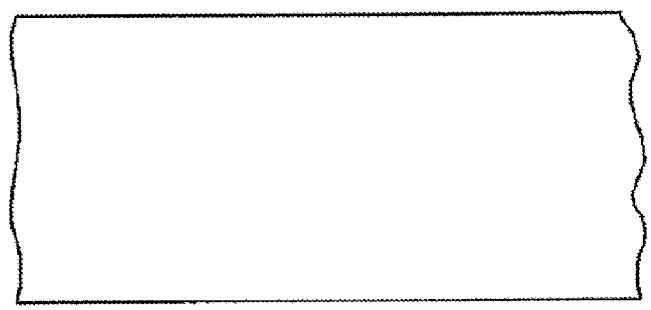
(a)
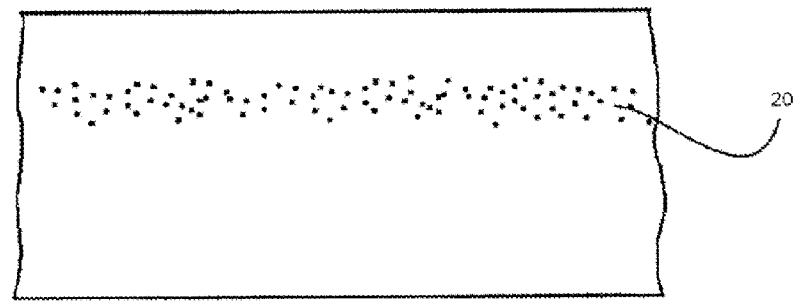
(b)

FIG. 14 RELATED ART
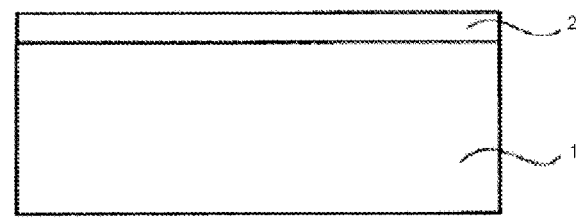
(a)
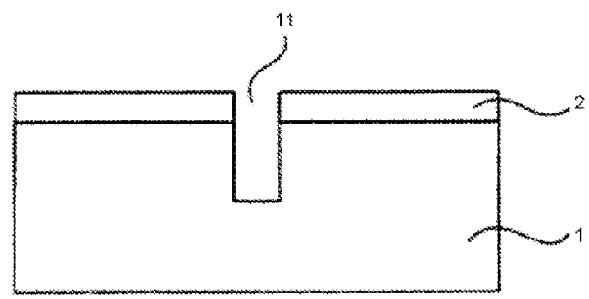
(b)
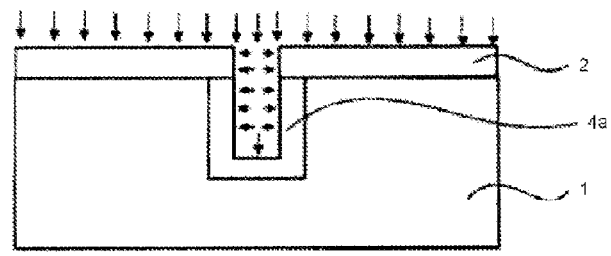
(c)

US 8,853,009 B2

METHOD FOR MANUFACTURING REVERSE-BLOCKING SEMICONDUCTOR ELEMENT

FIELD

The present invention relates to the improvement of a reverse-blocking semiconductor element manufacturing method that makes an insulated gate bipolar transistor (hereafter, abbreviated to an IGBT) in which the reliability of only forward voltage blocking capability is generally ensured have the reliability of reverse voltage blocking capability (hereafter, abbreviated to reverse blocking capability) equal to the reliability of forward voltage blocking capability (hereafter, abbreviated to forward blocking capability), and more particularly, to the improvement of a method of manufacturing a reverse blocking IGBT.

BACKGROUND

The reverse-blocking semiconductor element requires reverse blocking capability equal to forward blocking capability. In order to improve the reliability of the reverse blocking capability, it is necessary to bend a rear-surface-side reverse breakdown voltage pn junction which is generally formed flat in the vicinity of the side surface of the chip such that the termination of the junction extends from the rear surface to the front surface of the semiconductor chip. As such, in the following description, the diffusion layer for forming the extended pn junction which is bent from the rear surface to the front surface is referred to as a separation layer.

FIG. 12 is a cross-sectional view illustrating a main portion of the semiconductor substrate and illustrates a method of forming the separation layer using coating and diffusion according to the related art. FIG. 12 ((a) to (c)) is a cross-sectional view illustrating a main portion of the semiconductor substrate and illustrates the main manufacturing process for forming the separation layer of the reverse blocking IGBT according to the related art. FIG. 13 is a cross-sectional view illustrating the vicinity of the end of the reverse blocking IGBT including the separation layer formed by coating and diffusion according to the related art. Briefly, the manufacturing method illustrated in FIG. 13 is a method of manufacturing the separation layer using coating and diffusion. When the separation layer of the reverse blocking IGBT according to the related art is formed, first, as a dopant mask, an oxide film 2 which has a thickness of about 2.5 µm and is formed by thermal oxidation is formed on a thick semiconductor substrate 1 with a diameter of 6 inches and a thickness of about 625 µm (FIG. 12(a)).

Then, an opening portion 3 for forming a separation layer 4 is formed in the oxide film 2 on the semiconductor substrate 1 by patterning and etching (FIG. 12(b)). A boron source 5 is applied into the opening portion 3 formed in the oxide film 2 and a heat treatment is performed at a high temperature for a long time using a diffusion furnace to form a p-type diffusion layer 4a with a depth of about several hundreds of micrometers (FIG. 12(c)). The p-type diffusion layer can be used as the separation layer 4 by a treatment in the subsequent process, which will be described below.

Then, as illustrated in the cross-sectional view of FIG. 13 illustrating the end of the reverse blocking IGBT, a surface structure 10 required as a MOS semiconductor device is formed and the rear surface of the semiconductor substrate 1 is polished to the bottom of the separation layer 4 (a dashed line in FIG. 12(c)). Then, a rear surface structure including a p collector layer 6 and a collector electrode 7 is formed on the polished surface and the semiconductor substrate 1 is cut along a scribe line 8 which is disposed at the center of the separation layer 4. In this way, it is possible to obtain a reverse blocking IGBT chip illustrated in FIG. 13.

FIG. 14 is a cross-sectional view illustrating a main portion of the semiconductor substrate and illustrates a method of manufacturing a separation layer using a trench according to the related art. FIG. 15 is a cross-sectional view illustrating the vicinity of the end of a reverse blocking IGBT including the separation layer using the trench according to the related art. FIG. 14 ((a) to (c)) is a cross-sectional view illustrating the main portion of the semiconductor substrate and illustrates a process of forming the separation layer of the reverse blocking IGBT according to the related art which is different from that illustrated in FIG. 12. In the forming process, a trench (groove) 11 is formed in the rear surface of a semiconductor substrate 1 and a diffusion layer 4a is formed on the side surface of the trench and is used as a separation layer 4.

As illustrated in FIG. 14, in the process of forming the semiconductor substrate 1 which indicates a method of forming the separation layer using the trench according to the related art, first, a thick oxide film 2 with a thickness of several micrometers is formed on one surface of the semiconductor substrate 1 (FIG. 14(a)). Then, an opening 3 is formed in the oxide film 2 and anisotropic dry etching is performed for the semiconductor substrate 1 to form a trench 11 with a depth of about several hundreds of micrometers from the oxide film 2 in which the opening 3 is formed (FIG. 14(b)).

Then, impurities are introduced into the side surface of the trench 11 by vapor-phase diffusion to form the diffusion layer 4a illustrated in FIG. 14(c), that is, the separation layer 4 (FIG. 14(c) and FIG. 15). Then, the trench 11 is filled with a reinforcing material, such as polysilicon or an insulating film, and the semiconductor substrate 1 is diced into IGBT chips along a scribe line 8. In this way, a reverse blocking IGBT illustrated in FIG. 15 is completed.

For example, the following Patent Literature 1 to Patent Literature 3 disclose the method of forming the trench 11 and forming the separation layer 4 on the side surface of the trench. Patent Literature 1 discloses a manufacturing method which forms a vertical trench with a depth reaching a pn junction from the upper surface to the lower surface of a device chip so as to surround a device region of a semiconductor element and forms a p-type diffusion layer (separation layer) on the side surface of the trench such that the pn junction is connected to the p-type diffusion layer provided on the lower side of the device. In this way, the pn junction on the lower surface side of the device is bent by the separation layer and the termination of the junction extends to the upper surface of the device. Similarly to Patent Literature 1, Patent Literature 2 and Patent Literature 3 disclose a method which forms a trench with a depth reaching a pn junction from the upper surface to the lower surface of a device and forms a diffusion layer of the side surface of the trench such that the device has reverse blocking capability.

In the method of forming the separation layer of the reverse blocking IGBT using coating and diffusion illustrated in FIGS. 12(a) to 12(c), the boron source (liquid boron diffusion source) is coated onto the surface and a heat treatment is performed to diffuse boron. It is necessary to perform a diffusion process at a high temperature for a long time in order to form the separation layer with a diffusion depth of about several hundreds of micrometers. Therefore, in the method of forming the separation layer of the reverse blocking IGBT using coating and diffusion illustrated in FIGS. 12(a) to 12(c), defects, such as the deterioration of a quartz jig including a quartz board, a quartz pipe (quartz tube), and a quartz nozzle forming a diffusion furnace, contamination by a heater, and a reduction in strength due to the devitrification of the quartz jig, are inevitable.

In addition, in the formation of the separation layer by the coating and diffusion method, it is necessary to form a mask oxide film (oxide film). The mask oxide film needs to have good quality and a large thickness in order to withstand boron diffusion for a long time. A thermally-oxidized film is used to obtain a silicon oxide film with high mask resistance, that is, high quality.

However, as described above, when the separation layer is formed by the coating and diffusion method, it is necessary to form a thermally-oxidized film with a thickness of about 2.5 μm in order to prevent boron from penetrating through the mask oxide film in the process of diffusing boron in the separation layer at a high temperature for a long time (for example, 1300° C. and 200 hours). In dry (dry oxygen atmosphere) oxidation for obtaining a high-quality oxide film, an oxidation time of about 200 hours is required at an oxidation temperature of, for example, 1150° C. in order to form the thermally-oxidized film with a thickness of 2.5 μm.

In wet or pyrogenic oxidation in which film quality deteriorates slightly, but the oxidation time is shorter than that in the dry oxidation, a long oxidation time of about 15 hours is needed. In addition, during these oxidation processes, since a large amount of oxygen is introduced into the silicon semiconductor substrate, a crystal defect, such as an oxygen precipitate or an oxidation induced stacking fault, is introduced or an oxygen donor is generated. As a result, device characteristics deteriorate and reliability is reduced.

In diffusion after the boron source is applied, in general, the diffusion process is performed at a high temperature for a long time in an oxidation atmosphere. Therefore, oxygen is introduced between the lattices in the semiconductor substrate. In this process, crystal defects, such as an oxygen precipitate, the phenomenon of oxygen changing into a donor, an oxidation induced stacking fault (OSF), and a slip dislocation, are introduced. It has been known that, when these crystal defects are introduced, the amount of leakage current increases in the pn junction in the semiconductor substrate and the breakdown voltage and reliability of the insulating film formed on the semiconductor substrate deteriorate significantly. In addition, in some cases, oxygen introduced during diffusion is changed into a donor and the breakdown voltage is reduced.

In the method of forming the separation layer illustrated in FIGS. 12(a) to 12(c), boron is diffused from the opening portion of the mask oxide film substantially isotropically with a silicon bulk. Therefore, when boron is diffused to a depth of 200 μm in the depth direction, it is inevitable that boron is diffused 160 μm in the lateral direction. As a result, a device pitch or a chip size increases, which results in an increase in chip costs.

In the method of forming the separation layer illustrated in FIGS. 14(a) to 14(c), the trench is formed by dry etching and boron is introduced into the side wall of the formed trench to form the separation layer. Then, the trench is filled with a reinforcing material, such as an insulating film. In this way, a trench with a high aspect ratio is formed. As a result, in the forming method illustrated in FIGS. 14(a) to 14(c), the spreading of the separation layer in the lateral direction is less than that in the forming method illustrated in FIGS. 12(a) to 12(c). Therefore, the forming method illustrated in FIGS. 14(a) to 14(c) has an advantage that the device pitch is reduced.

However, when a typical dry etching is used, the processing time required for etching to a depth of about 200 μm is about 100 minutes per substrate and, for example, an increase in lead time and an increase in the number of maintenances are inevitable. When a deep trench is formed by dry etching and a silicon oxide film ($SiO_2$) is used as the mask, selectivity is equal to or less than 50 and a thick silicon oxide film with a thickness of about several micrometers is needed. Therefore, costs increase or yield is reduced due to the introduction of a process induced crystal defect, such as an oxidation induced stacking fault or an oxygen precipitate.

FIG. 16 is a cross-sectional view illustrating the vicinity of the end of the reverse blocking IGBT including the separation layer which is formed by the trench according to the related art and illustrates the problems of the reverse blocking IGBT. As illustrated in FIG. 16, in a process of forming the separation layer using a deep trench with a high aspect ratio which is formed by dry etching, the technical problems of a method of removing, for example, a chemical residue 12 or a resist residue 13 in a trench 11 are not sufficiently solved. Therefore, problems, such as a reduction in yield and a reduction in reliability, arise.

In general, when a dopant, such as phosphorus or boron, is introduced into the side wall of the trench, ion implantation is performed with the semiconductor substrate being inclined and the dopant is introduced into the side wall of the trench since the side wall of the trench is vertical. However, when a dopant is introduced into the side wall of the trench with a high aspect ratio, for example, the following problems arise: an effective dose is reduced (an increase in the implantation time); an effective projection range is narrowed; a dose loss occurs due to a screen oxide film; and uniformity in implantation is reduced.

Therefore, as a method of introducing impurities into the trench with a high aspect ratio, for example, a vapor-phase diffusion method which exposes a semiconductor substrate to a gasified dopant atmosphere, such as $PH_3$ (phosphine) or $B_2H_6$ (diborane), has been used instead of ion implantation. However, in the vapor-phase diffusion method, precise controllability is less than that in the ion implantation method.

When the trench with a high aspect ratio is filled with an insulating film, there is a concern that a gap which is called a void will be formed in the trench and reliability will be reduced. In the manufacturing methods disclosed in Patent Literature 1 to Patent Literature 3, it is considered that a process is needed which fills the trench with a reinforcing material in order to reduce the breaking of a wafer and cuts the semiconductor substrate into semiconductor chips along the scribe lines. In this case, manufacturing costs are increased by a value corresponding to the additional process of filling the reinforcing material.

In addition, a method for solving the above-mentioned various problems has been proposed. For example, a method has been known which implants ions into the side surface of a chip including a tapered groove (a groove formed such that the side surface thereof is inclined at a predetermined tilt angle with respect to the main surface) which is inclined in the direction in which the surface area of one of an emitter and a collector is less than that of the other and performs an annealing process to form a separation layer 4b.

FIG. 17 is a cross-sectional view illustrating a reverse blocking IGBT including a separation layer on a tapered surface which is formed by anisotropic etching. As illustrated in FIG. 17(a), a method has been known which forms a tapered groove using selective anisotropic etching in a chip including the tapered groove which is inclined in the direction in which the surface area of the emitter is less than that of the collector (for example, see the following Patent Literature 4 and Patent Literature 5).

On the contrary to the reverse blocking IGBT illustrated in FIG. 17(a), in a reverse blocking IGBT (see FIG. 17(b) and the following Patent Literature 6) including a tapered side surface which is inclined in the direction in which the surface area of the collector is less than that of the emitter, the emitter-side surface is larger than that in the reverse blocking IGBT illustrated in FIG. 17(a). That is, the area of a region which is formed in the vicinity of the emitter-side surface and can be used as an n emitter region 15 and a p base region 16 increases and current density can be increased. Therefore, it is possible to reduce the area of a chip for the same current rating.

In FIG. 17, reference numeral 1 indicates a semiconductor substrate, reference numeral 6 indicates a collector layer, and reference numeral 7 indicates a collector electrode. In all of the reverse blocking IGBTs including the tapered groove, the separation layer 4b is formed by ion implantation and the annealing process. Therefore, it is possible to solve the above-mentioned problems, that is, the crystal defects due to thermal diffusion performed for a long time, the detects caused by oxygen, and the damage of the furnace. Since the aspect ratio is less than that in the manufacturing method using the deep trench illustrated in FIG. 14, the chemical residue or the resist residue described with reference to FIG. 16 is not formed when the tapered groove is formed and it is possible to simply introduce the dopant using ion implantation for the inclined side surface.

In addition, for example, a technique has been known which heats a semiconductor substrate at a temperature of 400° C. to 500° C. and performs ion implantation to improve the activation rate (Patent Literature 7).

CITATION LIST

Patent Literature

Patent Literature 1: JP 2-22869 A
Patent Literature 2: JP 2001-185727 A
Patent Literature 3: JP 2002-76017 A
Patent Literature 4: JP 2006-156926 A
Patent Literature 5: JP 2004-336008 A
Patent Literature 6: JP 2006-303410 A
Patent Literature 7: JP 2005-268487 A

TECHNICAL PROBLEM

However, in the reverse blocking IGBTs with the tapered groove disclosed in Patent Literature 4 to Patent Literature 6, since long-time diffusion is not used, a thin (or shallow) separation layer is formed. As a result, when the crystal defects caused by ion implantation are not sufficiently recovered by the annealing process, the crystal defects remain in the vicinity of the pn junction of the separation layer. Therefore, a leakage current is likely to increase when a reverse bias is applied and the reverse breakdown voltage which is designed to obtain a predetermined blocking voltage is likely to be reduced.

In the known laser annealing process or the annealing process for activation using a flash lamp, when the focal position (the position which effectively contributes to activating the separation layer of the tapered groove during a lamp annealing process) is not appropriately controlled, the separation layer is not sufficiently activated and the crystal defects remain.

The invention has been made in view of the above-mentioned problems and an object of the invention is to provide a method of manufacturing a reverse-blocking semiconductor element that includes a process of manufacturing a diffusion layer formed by forming a tapered groove and performing ion implantation and an annealing process for the side surface of the tapered groove as a separation layer for bending the termination of a reverse breakdown voltage pn junction to extend to a surface and can ensure a reverse breakdown voltage and reduce a leakage current when a reverse bias is applied.

SUMMARY

In order to solve the above-mentioned problems, according to an aspect of the invention, a method of manufacturing a reverse-blocking semiconductor element includes a step of forming a main surface structure including a MOS gate structure on one main surface of a first-conduction-type semiconductor substrate, a step of forming a second-conduction-type collector layer on the other main surface, and a step of forming a second-conduction-type separation layer, which connects the two main surfaces and is connected to the second-conduction-type collector layer on the other main surface, along a side surface of a tapered groove which is formed from the one main surface to the other main surface by etching in the outer circumference of the main surface structure. In the step of forming the second-conduction-type collector layer and the step of forming the second-conduction-type separation layer, second-conduction-type impurity element ions are implanted into the semiconductor substrate while the semiconductor substrate is maintained at a temperature of 400° C. or 500° C. and a laser annealing process and a furnace annealing process at a temperature of 350° C. or 500° C. are performed to form each of the second-conduction-type collector layer and the second-conduction-type separation layer.

In the method of manufacturing the reverse-blocking semiconductor element according to the above-mentioned aspect of the invention, after the laser annealing process is performed, the furnace annealing process at a temperature of 350° C. or 500° C. may be performed.

In the method of manufacturing the reverse-blocking semiconductor element according to the above-mentioned aspect of the invention, after the furnace annealing process at a temperature of 350° C. or 500° C. is performed, the laser annealing process may be performed.

In the method of manufacturing the reverse-blocking semiconductor element according to the above-mentioned aspect of the invention, the step of forming the second-conduction-type collector layer and the step of forming the second-conduction-type separation layer may be performed at the same time.

In the method of manufacturing the reverse-blocking semiconductor element according to the above-mentioned aspect of the invention, a retention time of the furnace annealing process at a temperature of 350° C. or 500° C. may be from 1 hour to 10 hours.

ADVANTAGEOUS EFFECTS OF INVENTION

According to the invention, it is possible to provide a method of manufacturing a reverse-blocking semiconductor element that includes a process of manufacturing a diffusion layer formed by forming a tapered groove and performing ion implantation and an annealing process for the side surface of the tapered groove as a separation layer for bending the termination of a reverse breakdown voltage pn junction to extend to a surface and can ensure a reverse breakdown voltage and reduce a leakage current when a reverse bias is applied.

BRIEF DESCRIPTION OF THE DRAWINGS

FIG. 1 is a cross-sectional view illustrating a semiconductor substrate and illustrates a main manufacturing process in a method of manufacturing a reverse-blocking semiconductor element according to the invention;

FIG. 2 is a diagram illustrating the impurity concentration profiles of a collector layer and a separation layer according to Embodiment 1 of the invention;

FIG. 4-1 is a cross-sectional view (part 1) illustrating a semiconductor substrate and illustrates the implantation direction of ions for forming the separation layer on a tapered surface;

FIG. 4-2 is a cross-sectional view (part 2) illustrating the semiconductor substrate and illustrates the implantation direction of the ions for forming the separation layer on the tapered surface;

FIG. 6 is a cross-sectional view (the related art) illustrating the remaining state of crystal defects when the ion-implanted region of the tapered surface is activated by the laser annealing process according to the related art, in which (a) is a cross-sectional view illustrating the state of the crystal defects in the collector layer and (b) is a cross-sectional view illustrating the state of the crystal defects in the separation layer;

FIG. 14 is a cross-sectional view illustrating a main portion of the semiconductor substrate and illustrates a method of forming a separation layer using a trench according to the related art;

DETAILED DESCRIPTION

Hereinafter, a method of manufacturing a reverse-blocking semiconductor element according to embodiments of the invention will be described in detail with reference to the accompanying drawings. The invention is not limited to the following embodiments as long as it does not depart from the scope and spirit thereof. In the following description, a first conduction type is an n type and a second conduction type is a p type. In addition, one main surface is an emitter side or a front surface of an IGBT and the other main surface is a collector side or a rear surface of the IGBT.

Hereinafter, an n-type reverse blocking IGBT is used as a reverse-blocking semiconductor element according to the invention. In particular, a method of manufacturing a reverse blocking IGBT in which a side surface is formed by a groove tapered in a direction in which the surface area of the collector is less than that of the emitter will be described. The same manufacturing process as that in the related art will be described as simply as possible.

The description of Embodiments 1 and 2 is divided into the description of characteristic portions of the invention and the description of the effect of the invention related to the characteristic portions. In particular, the formation of a p-type collector layer and a separation layer, which are the characteristic portions of the invention, by ion implantation and the subsequent annealing method using a laser annealing process and a furnace annealing process are compared with the effects of the related art and Comparative examples 1 and 2 to clarify the beneficial effect of the invention.

Figures 1, 4:
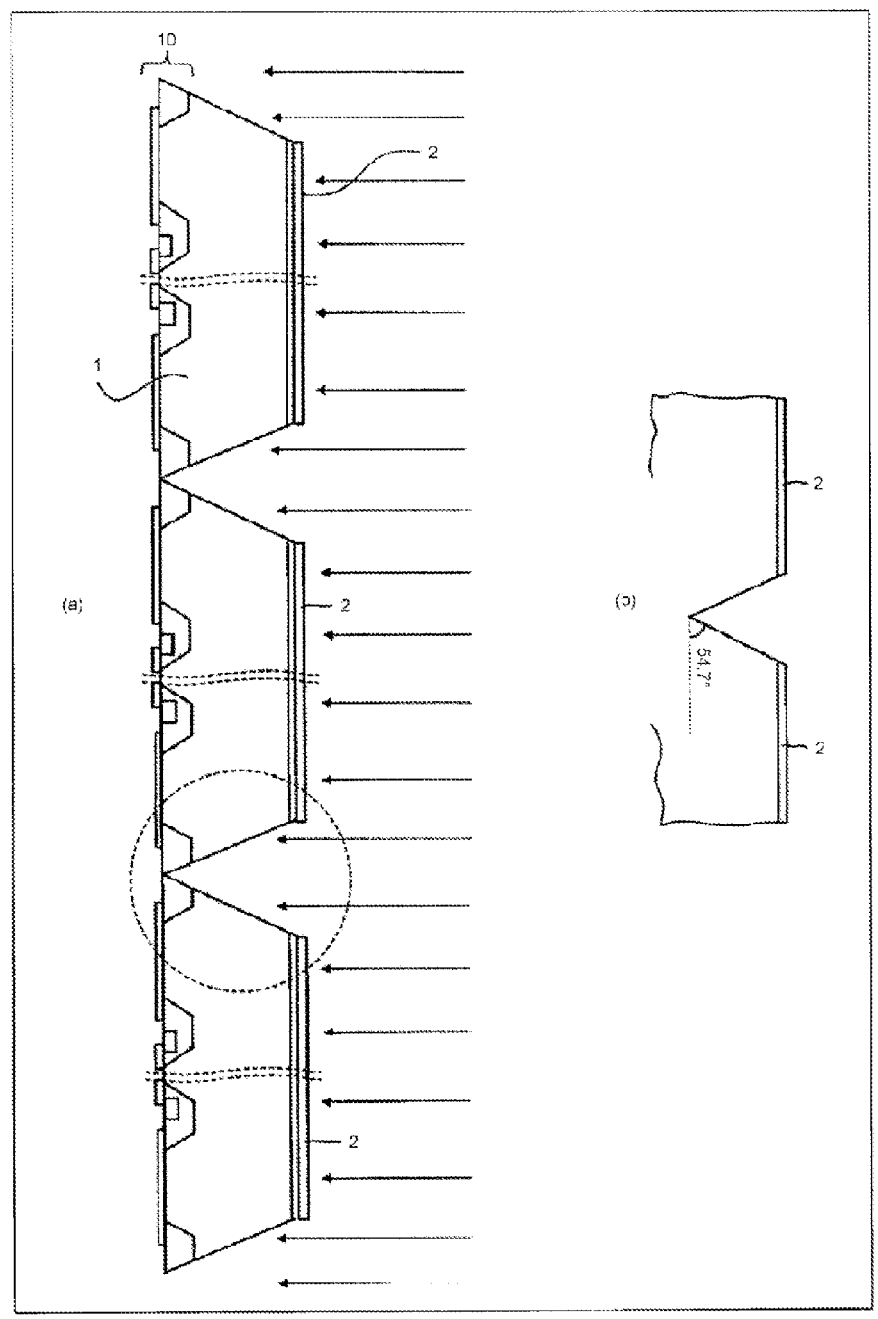

FIG. 1 is a cross-sectional view illustrating a semiconductor substrate and illustrates a main manufacturing process of a method of manufacturing the reverse-blocking semiconductor element according to the invention. First, according to the known technique, as illustrated in FIG. 1, in a surface layer of the (001) plane which is the main surface of an FZ-n semiconductor substrate (hereinafter, referred to as a "semiconductor substrate") 1 illustrated in FIG. 1(a), a p base region 16 and an n emitter region 15 are formed in an element activation region in which a main current flows in a device region, as illustrated in FIG. 1(b). The n emitter region 15 is provided in the p base region 16.

A gate electrode 22 is formed on the surface of the p base region 16 which is interposed between the surface of the semiconductor substrate 1 and the n emitter region 15 with a gate insulating film 21 interposed therebetween to form a MOS gate structure. An interlayer insulating film 23 is formed so as to cover the gate electrode 22. Then, a common emitter electrode 24 which comes into contact with the p base region 16 and the n emitter region 15 is provided to form a surface structure 10 of the reverse blocking IGBT. For example, the emitter electrode 24 is formed by forming an Al/Si film using sputtering and performing a heat treatment for the Al/Si film at a temperature of 400° C. to 500° C.

Then, as illustrated in FIG. 1(c), a tapered groove including four side surfaces having the {111} plane as the main plane orientation is formed in the rear surface of the FZ-n semiconductor substrate 1 by anisotropic etching with a known alkali etching solution (a KOH aqueous solution or a solution including 5% of TMAH (Tetra Methyl Ammonium Hydroxide)), using the insulating film (not illustrated) as a mask.

At that time, an etching mask pattern is formed such that the MOS gate structure of the reverse blocking IGBT is arranged on the surface of a region surrounded by the tapered groove. It is preferable that, during the anisotropic etching, a supporting plate (not illustrated) be attached to the surface such that device chips are not dispersed after etching ends. In addition, the depth of the tapered groove may be less than the thickness of the semiconductor substrate 1 and the process may be performed without using the supporting plate.

As illustrated in FIG. 1(d), the implantation of ions into a p-type collector layer 6 and a separation layer 4 formed on the rear surface of the semiconductor substrate 1 is performed for the side surface or the main surface of the tapered groove after an oxide film mask (not illustrated) obtained by opening a desired region of a low-temperature oxide film is formed. In the invention, one of the conditions is that the substrate temperature when ions are implanted into the separation layer 4 is in the range of 400° C. to 500° C.

The ion implantation conditions are that a boron dose is $1 \times 10^{15}$ cm$^{-2}$, an acceleration voltage is 150 keV, and then furnace annealing and laser annealing are performed as an annealing process in this order or the reverse order. The irradiation energy density of a YAG2ω laser (a wavelength of 532 nm and a pulse width of 100 ns) is 3 J/cm$^2$ and the furnace annealing is performed at a temperature of 350° C. to 500° C. for one hour to 10 hours.

Figures 2, 4:
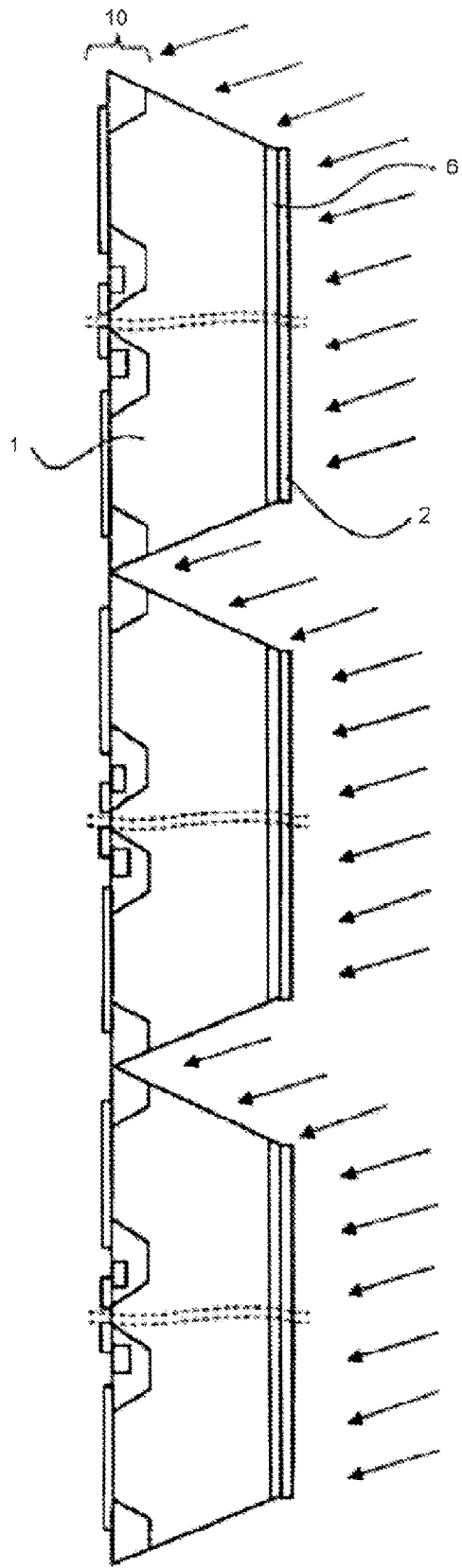

FIGS. 4-1 and 4-2 are cross-sectional views illustrating the semiconductor substrate and illustrate the direction in which ions for forming the separation layer are implanted into the tapered surface. In the case of a rectangular chip, for example, as illustrated in FIG. 4-1, a mask 2 can be formed on the main surface and ion implantation can be performed for four side surfaces at a time. In addition, in the case of the rectangular chip, for example, in the ion implantation for four side surfaces, the side surface has a tapered shape which is inclined with respect to the main surface. Therefore, as illustrated in FIG. 4-2, after the mask 2 is formed on the main surface, the inclination of the semiconductor substrate may be changed and ion implantation may be performed for four side surfaces four times while rotating the substrate by 90 degrees. In this way, it is possible to perform doping at a tilt angle different from the angle of the tapered surface.

In the laser annealing process, it is preferable to selectively scan and irradiate a desired portion using, for example, a mask made of SUS (stainless steel) or the control of a shutter (shielding plate). The furnace annealing process using an electric furnace which is maintained at a constant temperature is performed at a temperature of 350° C. to 500° C. which is sufficiently low not to have an adverse effect on emitter-side surface structures, such as the n emitter region 15, the p base region 16, the gate insulating film 21, the gate electrode 22, and the emitter electrode 24 formed by the preceding process, and is effective in annealing for activation.

Then, a sputtering metal film, which is a laminate of Al/Ti/Ni/Au, is vapor-deposited on the surface of the collector layer 6 to form a collector electrode 7. After the collector electrode 7 is provided on the surface of the collector layer 6, a metal electrode on the tapered side surface is removed and the tapered groove is cut at the center or the supporting plate is removed. In this way, a reverse blocking IGBT chip can be formed on the surface.

The above-mentioned manufacturing method including the process of forming the diffusion layer (separation layer 4) only in four side surfaces of the device chip can also be applied to a reverse blocking IGBT in which a side surface is tapered in the direction in which the surface area of the collector is less than that of the emitter. In the reverse blocking IGBT in which the surface area of the emitter is less than that of the collector, it is possible to perform ion implantation and an annealing process for the collector layer 6 and the separation layer 4 at the same time, without separately performing the ion implantation and the annealing process. In this way, in the reverse blocking IGBT, it is possible to reduce the number of lithography processes and ion implantation processes for forming a mask by one, as compared to when the ion implantation and the annealing process are separately performed for the collector layer 6 and the separation layer 4. Therefore, it is possible to reduce manufacturing costs, which is preferable.

In the ion implantation, as illustrated in FIGS. 4-1 and 4-2, when boron ions are implanted into the collector whose surface area is less than that of the device chip at a tilt angle of 0°, an effective dose and an ion implantation range for the side surface are cos 54.7°=0.58 which is the product of cosine and a taper angle which is formed by anisotropic etching and is determined by plane orientation.

In the laser annealing process for the tapered surface when the separation layer is formed, energy density is 0.58 times the density of energy radiated in the annealing process for the collector surface. Therefore, it is necessary to set the conditions of the ion implantation and the laser annealing process, considering the value of 0.58.

(Description of Manufacturing Method According to Related Art)

When boron ions are implanted into the rear surface to form the separation layer 4, the substrate temperature is set to a room temperature during ion implantation and the ion implantation is performed with a boron dose of $1 \times 10^{15}$ cm$^{-2}$ at an acceleration voltage of 150 keV. Then, only the laser annealing process is performed as the annealing process. The conditions of the laser annealing process are that the irradiation energy density of a YAG2ω laser (a wavelength of 532 nm and a pulse width of 100 ns) is 3 J/cm².

Figure 5:
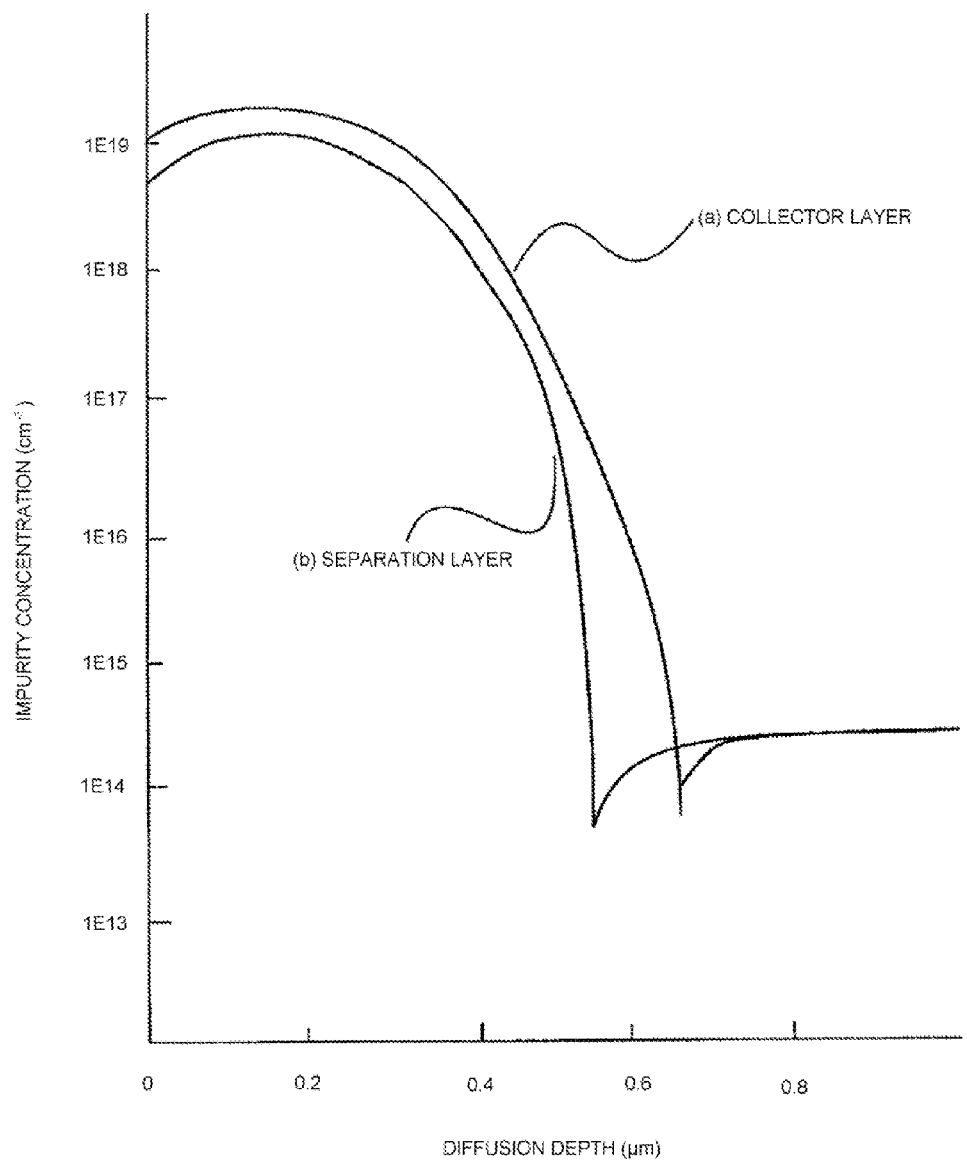
FIG. 5 is a diagram (the related art) illustrating the impurity concentration profile of a separation layer formed by activating an ion-implanted region of a tapered surface using a laser annealing process according to the related art.

FIG. 5 illustrates the measurement result (the measurement result of spreading resistance) of the SR concentration profiles of the collector layer 6 and the separation layer 4 which are formed at the same time. FIG. 5 is a diagram (the related art) illustrating the impurity concentration profile of the separation layer formed by activating an ion-implanted region of the tapered surface using the laser annealing process according to the related art.

FIG. 6 is a cross-sectional view (the related art) illustrating the remaining state of a crystal defect when the ion-implanted region of the tapered surface is activated by the laser annealing process according to the related art. In FIG. 6, (a) is a cross-sectional view illustrating the state of the crystal defects of the collector layer and (b) is a cross-sectional view illustrating the state of the crystal defects of the separation layer. FIG. 6 illustrates crystal defects 20 (point detects) of the collector layer 6 and the separation layer 5 (side surface) when irradiation is performed under the conditions of the ion implantation and the laser annealing process according to the related art.

Figure 7:
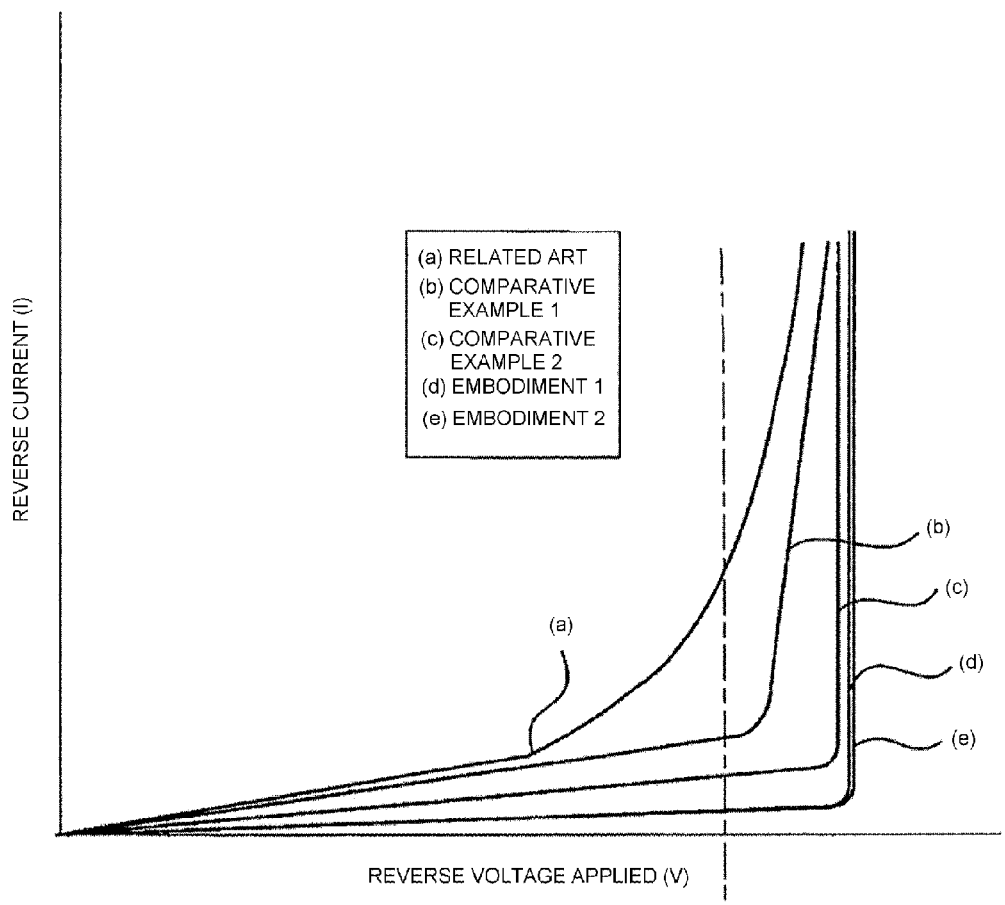
FIG. 7 is a diagram illustrating reverse current-voltage waveforms in reverse blocking IGBTs (comparative example) according to the invention, comparative examples, and the related art.

FIG. 7 is a diagram illustrating the waveforms of a reverse current and a reverse voltage in the reverse blocking IGBTs according to the invention, Comparative examples, and the related art (comparative example). FIG. 7 illustrates the comparison among leakage currents (hereinafter, referred to as reverse leakage currents) when a reverse bias is applied to the reverse blocking IGBTs according to the related art, the following Comparative examples 1 and 2, and Embodiments 1 and 2 of the invention. In FIG. 7, (a) illustrates the current-voltage waveform according to the related art, (b) illustrates the current-voltage waveform according to Comparative example 1, (c) illustrates the current-voltage waveform according to Comparative example 2, (d) illustrates the current-voltage waveform according to Embodiment 1, and (e) illustrates the current-voltage waveform according to Embodiment 2.

In Comparative example 1 and Comparative example 2, the substrate temperatures during ion implantation for the separation layer are 400° C. and 500° C. (room temperature in the related art) and a furnace annealing process (Comparative example 1) and a laser annealing process (Comparative example 2) are independently performed as the annealing process. Embodiments 1 and 2 are similar to Comparative examples 1 and 2 in that the substrate temperatures during ion implantation for the separation layer are 400° C. and 500° C., as described above. Embodiments 1 and 2 are characterized in that two kinds of annealing processes are combined with each other such that the laser annealing process and the furnace annealing process are performed in this order or the reverse order thereof.

The reason why Comparative examples 1 and 2 are introduced in the description of the invention is to clarify the effect of the invention. That is, Embodiments 1 and 2 are characterized in that two kinds of annealing processes, that is, the laser annealing process and the furnace annealing process are combined with each other. However, the effect of the invention overlaps the effect of Comparative examples 1 and 2 in that activation or a reduction in crystal defect is obtained by an increase in the substrate temperature during ion implantation and the annealing process of the invention and is not clear.

Returning to the description of the related art, as can be seen from the vertical axis (impurity concentration) of FIG. 5 illustrating the related art, the collector layer and the separation layer have a peak concentration of more than $1\times10^{19}$ cm$^{-3}$ and are sufficiently activated in the device according to the related art. This is the effect of the laser annealing process.

However, a diffusion depth represented by the horizontal axis of FIG. 5 is less than that in the SR concentration profiles (FIGS. 2 and 3) of Embodiments 1 and 2, which will be described below. In FIG. 6, as illustrated in (a), the crystal defect 20 does not remain in the collector layer. As illustrated in (b), the crystal defect 20 (point detect) incidentally formed during ion implantation remains in the side surface (separation layer).

As illustrated in the current-voltage waveform (a) of the device according to the related art illustrated in FIG. 7(a), the remaining crystal defect causes the reverse current (reverse leakage current) to be more than the reverse current (reverse leakage current) in (d) and (e) indicating the waveforms of Embodiments 1 and 2 to be described below in which there is no remaining crystal defect in the separation layer. As such, the crystal defect remains in the side surface (separation layer) since it is difficult to sufficiently recover the crystal defects caused by ion implantation for the side surface of the separation layer using the laser annealing process.

The laser annealing process which is performed for the rear surface of the substrate is laser irradiation for a short time (several tens of nanoseconds to several microseconds), in which the focal position of irradiation is likely to deviate from the separation layer, without being aligned with the separation layer. That is, in the laser annealing process for the rear surface of the substrate, an irradiation region is not the entire separation layer, but may be a portion of the separation layer. Therefore, the laser annealing process has an advantage that it does not have an adverse effect on the surface structure of the device. However, a region with the effect of recovering the crystal defect caused by annealing is limited and defects in a region which is close to the surface in the separation layer formed in the tapered portion are not likely to be sufficiently recovered. As a result, the reverse leakage current increases.

(Description of Manufacturing Method According to Comparative Example 1)

In Comparative example 1, unlike the related art, when a p collector layer is formed on the rear surface of the substrate, boron ions are implanted into the rear surface of the FZ-n substrate with the FZ-n substrate heated at a temperature of 400° C. to 500° C. and the furnace annealing process is performed as the annealing process. For example, the FZ-n substrate is placed on a sample table provided with a substrate heating mechanism, such as a heater, with the front surface (the surface on which a surface electrode is formed) down. Then, the FZ-n substrate is heated at a predetermined temperature (400° C. to 500° C.) and boron ions are implanted into the rear surface (the surface on which the p collector layer is formed) of the semiconductor substrate (FZ-n semiconductor substrate) 1. The conditions of the furnace annealing process are 400° C. and 5 hours.

Figure 8:
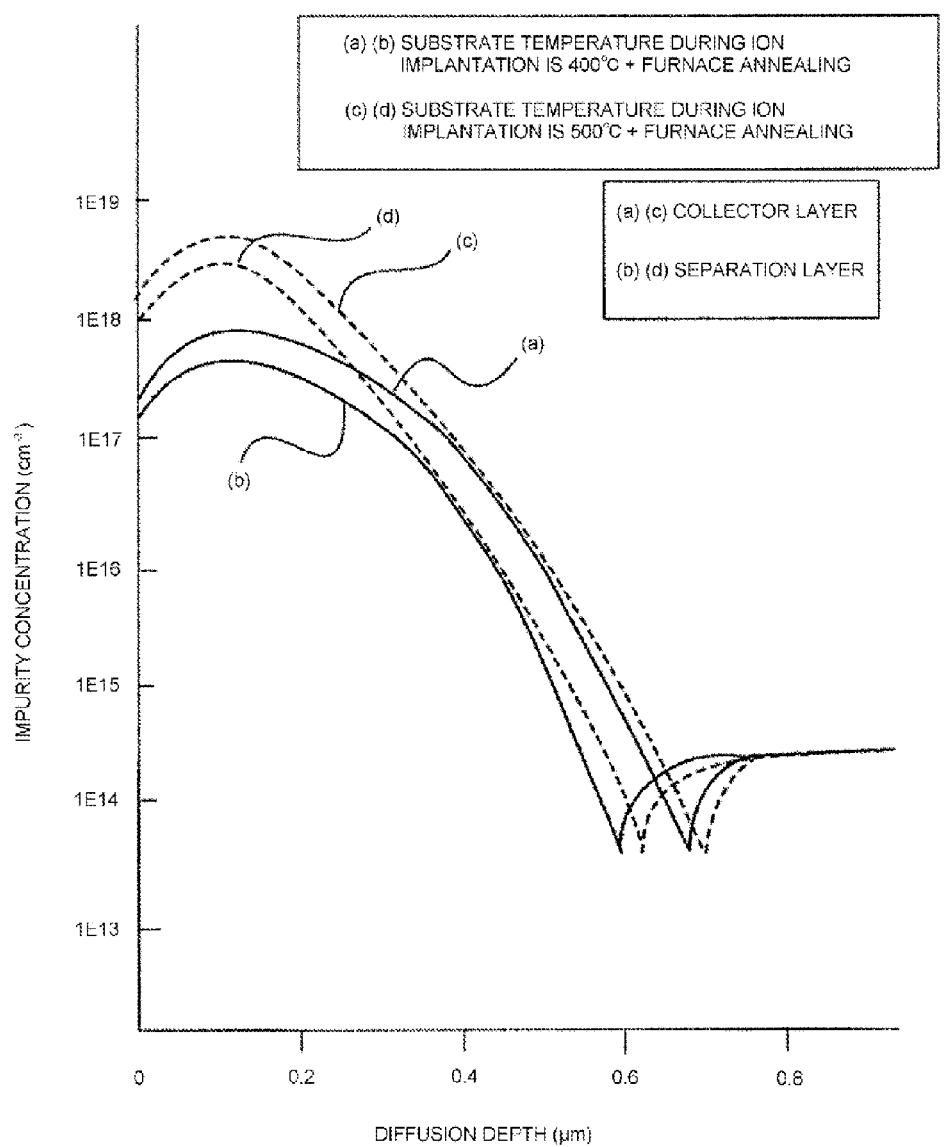
FIG. 8 is a diagram illustrating the impurity concentration profiles of a collector layer and a separation layer according to Comparative example 1, in which (a) and (b) are diagrams illustrating the impurity concentration profiles of the collector layer (a) and the separation layer (b) when the substrate temperature during ion implantation is 400° C. and furnace annealing is performed and (c) and (d) are diagrams illustrating the impurity concentration profiles of the collector layer (c) and the separation layer (d) when the substrate temperature during ion implantation is 500° C. and furnace annealing is performed.

Next, a concentration profile (spreading resistance method (SR method)) when boron ions are implanted while the semiconductor substrate 1 is heated at a temperature of 400° C. to 500° C. will be described. FIG. 8 is a diagram illustrating the impurity concentration profiles of the collector layer and the separation layer according to Comparative example 1. In FIG. 8, (a) and (b) are diagrams illustrating the impurity concentration profiles of the collector layer (a) and the separation layers (b) when the substrate temperature during ion implantation is 400° C. and the furnace annealing process is performed as the annealing process and (c) and (d) are diagrams illustrating the impurity concentration profiles of the collector layer (c) and the separation layer (d) when the substrate temperature during ion implantation is 500° C. and the furnace annealing process is performed as the annealing process.

In FIG. 8, the horizontal axis indicates the depth (μm) of a boron ion implantation region from the rear surface of the FZ-n substrate and the vertical axis indicates the concentration ($cm^{-3}$) of boron in the boron ion implantation region. The ion implantation conditions of boron are that the semiconductor substrate 1 is heated at a temperature of 400° C. or 500° C. and boron ions are implanted into the rear surface with a dose of $1 \times 10^{15}$ $cm^{-2}$ at an acceleration energy of 150 keV.

For a boron ion implantation layer, during ion implantation while the semiconductor substrate 1 is being heated, the activation rate of the boron ion implantation layer is about 2% when an ion implantation temperature by the heating of the substrate is 400° C. and is about 5% when the ion implantation temperature is 500° C. When the ion implantation temperature is equal to or more than 500° C., an emitter electrode made of Al/Si is likely to be dissolved, which is not preferable.

As can be seen from FIG. 8, peak concentration is $1 \times 10^{17}$ $cm^{-3}$ to $7 \times 10^{18}$ $cm^{-3}$ and is less than that illustrated in FIG. 5. The concentration is low since the degree of activation in the furnace annealing process is less than that in the annealing process (laser annealing process) according to the related art illustrated in FIG. 5. For both the collector layer and the separation layer, the depth of the boron ion implantation layer is slightly more than that in the related art illustrated in FIG. 5 due to the substrate temperature during ion implantation and the furnace annealing process at a temperature of 400°.

Figure 9:
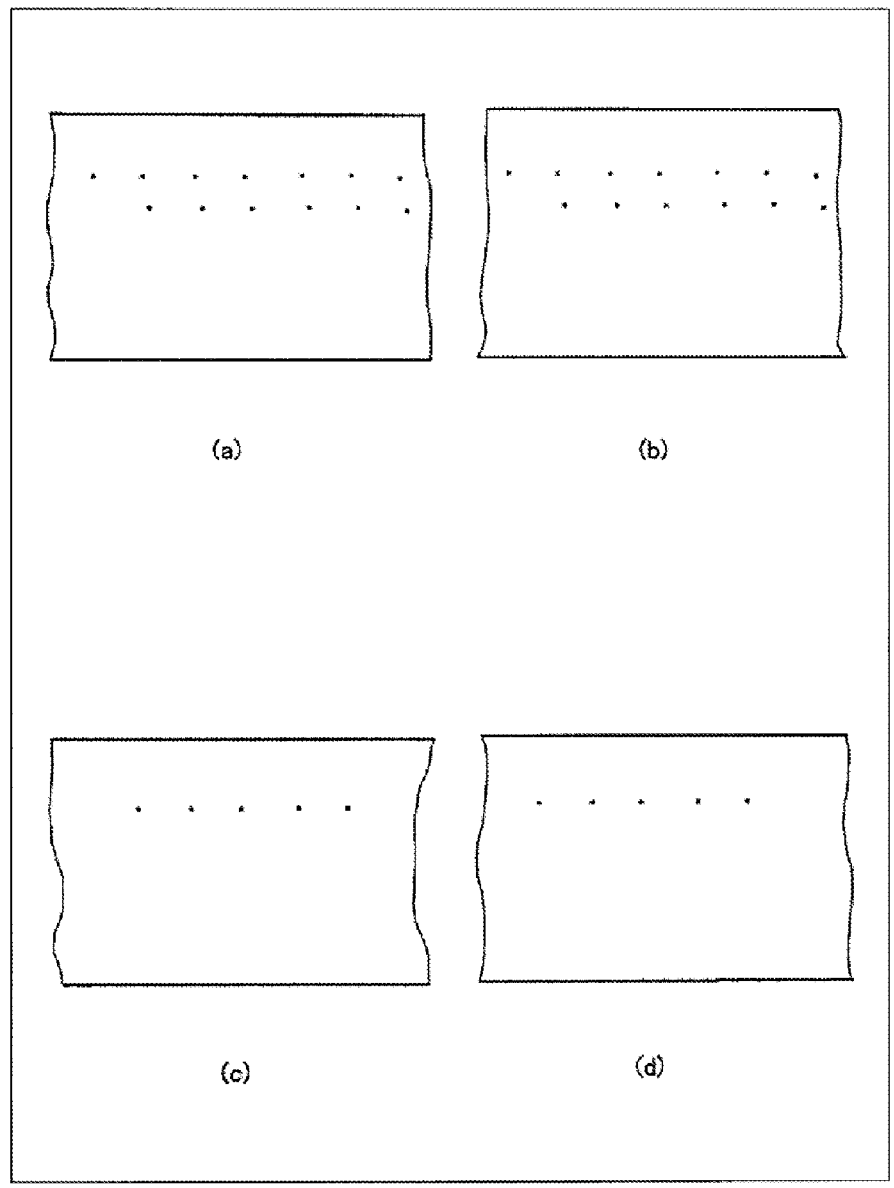
FIG. 9 is a cross-sectional view illustrating the remaining state of crystal defects according to Comparative example 1, in which (a) and (b) are cross-sectional views illustrating the state of the crystal defects in the collector layer and the separation layer when the substrate temperature during ion implantation is 400° C. and (c) and (d) are cross-sectional views illustrating the state of the crystal defects in the collector layer and the separation layer when the substrate temperature during ion implantation is 500° C.

The distribution state of the crystal defects in the collector layer and the separation layer will be described. FIG. 9 is a cross-sectional view illustrating the remaining state of the crystal defects in Comparative example 1. In FIG. 9, (a) and (b) are cross-sectional views illustrating the states of the crystal defects in the collector layer and the separation layer in the case of the substrate temperature during ion implantation at a temperature of 400° C. and (c) and (d) are cross-sectional views illustrating the states of the crystal defects in the collector layer and the separation layer in the case of the substrate temperature during ion implantation at a temperature of 500° C. As illustrated in FIG. 9, the comparison between the furnace annealing process at a temperature of 400° C. and the furnace annealing process at a temperature of 500° C. shows that the number of crystal defects in the furnace annealing process at 500° C. is less than that in the furnace annealing process at a temperature of 400° C. Therefore, the heating of the substrate during ion implantation contributes to reducing the crystal defects.

The comparison between the distribution state of the crystal defects in the separation layer according to the related art illustrated in FIG. 6(b) and that in Comparative example 1 illustrated in FIG. 9 illustrates that the number of crystal defects in Comparative example 1 is less than that in the related art. As such, since the number of crystal defects is reduced, the reverse leakage current in Comparative example 1 (FIG. 7(b)) is less than that in the related art (FIG. 7(a)), as illustrated in FIGS. 7(a) and 7(b).

(Description of Manufacturing Method According to Comparative Example 2)

The processes in Comparative example 2 are similar to those in Comparative example 1 except that the annealing process is changed from the furnace annealing process to the laser annealing process. The conditions of the laser annealing process are the same as those of the laser annealing process in the related art. That is, the irradiation energy density of the YAG2ω laser (a wavelength of 532 nm and a pulse width of 100 ns) is 3 J/$cm^2$.

Figure 10:
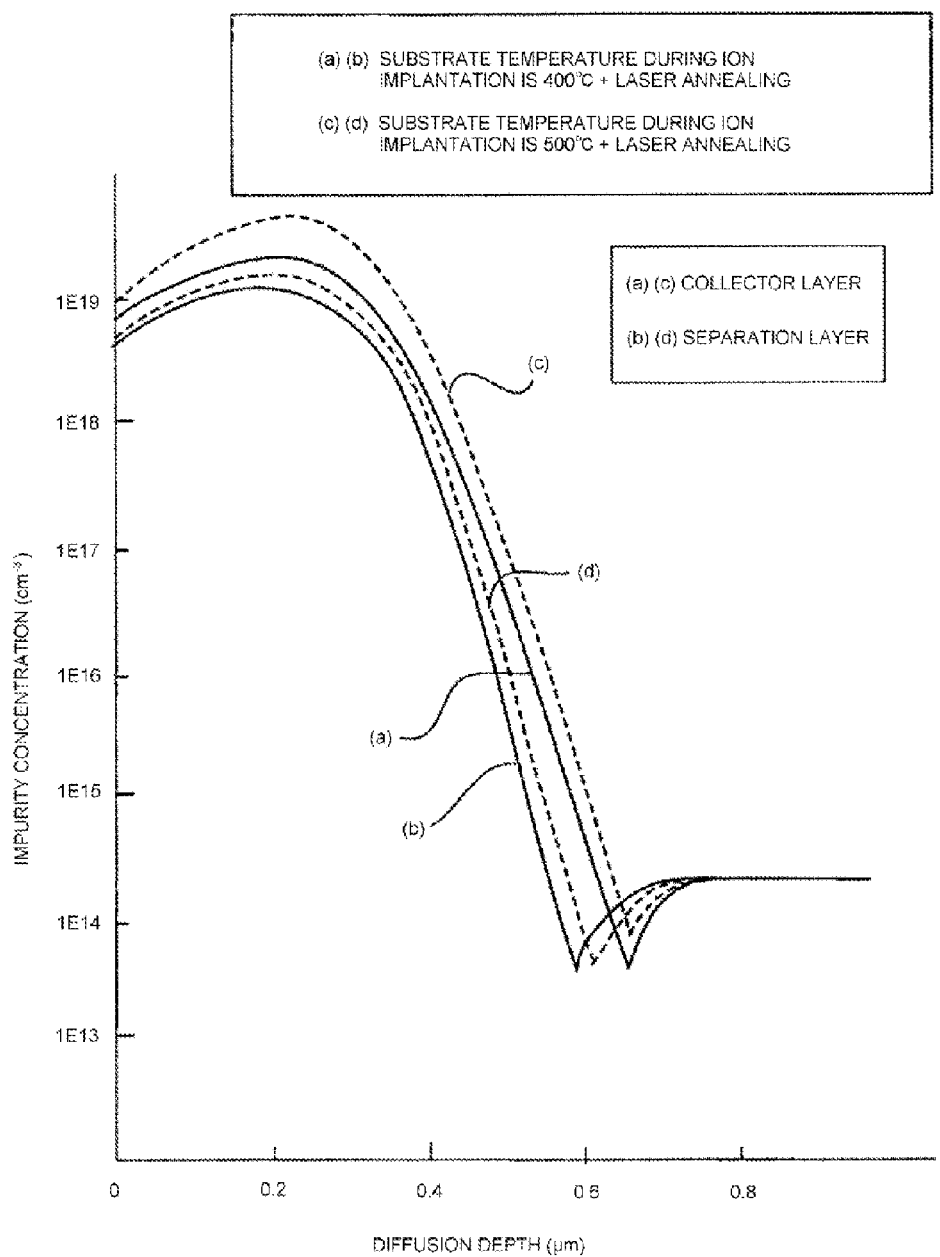
FIG. 10 is a diagram illustrating the impurity concentration profiles of a collector layer and a separation layer according to Comparative example 2, in which (a) and (b) are diagrams illustrating the impurity concentration profiles of the collector layer (a) and the separation layer (b) when the substrate temperature during ion implantation is 400° C and laser annealing is performed and (c) and (d) are diagrams illustrating the impurity concentration profiles of the collector layer (c) and the separation layer (d) when the substrate temperature during ion implantation is 500° C and laser annealing is performed.

Next, the measurement result (the measurement result of spreading resistance) of the SR concentration profiles of the collector layer and the separation layer will be described. FIG. 10 is a diagram illustrating the impurity concentration profiles of a collector layer and a separation layer according to Comparative example 2. FIG. 10, (a) and (b) are diagrams illustrating the impurity concentration profiles of the collector layer (a) and the separation layer (b) when the substrate temperature during ion implantation is 400° C and laser annealing is performed and (c) and (d) are diagrams illustrating the impurity concentration profiles of the collector layer (c) and the separation layer (d) when the substrate temperature during ion implantation is 500° C and laser annealing is performed. In Comparative example 2, since the substrate is heated at a temperature of 400° C. and 500° C. during ion implantation and laser annealing is performed, the impurity concentration of the collector layer and the separation layer is higher than that in Comparative example 1 and is slightly higher than that in the related art illustrated in FIG. 5.

Figure 11:
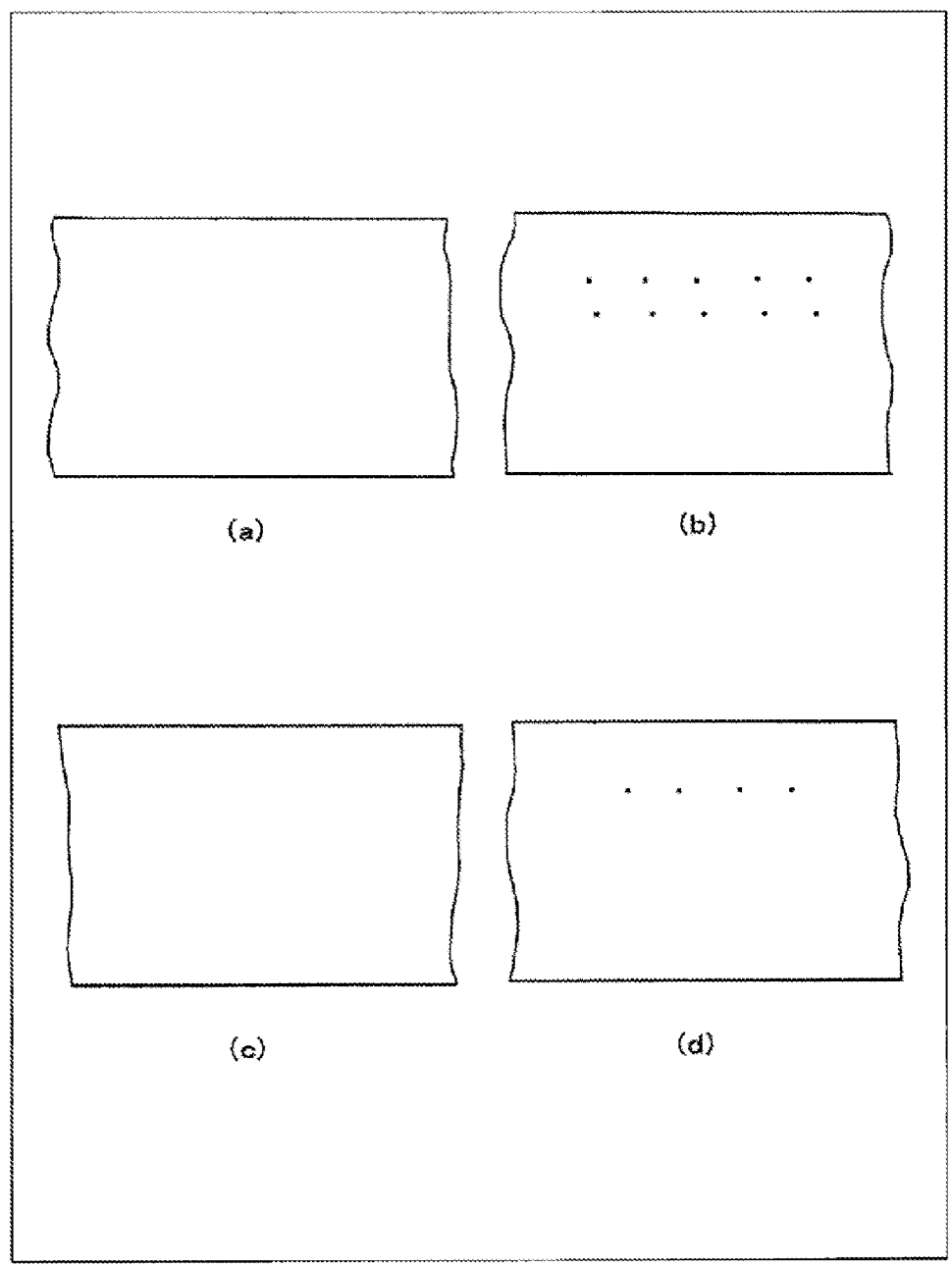
FIG. 11 is a cross-sectional view illustrating a portion of a separation layer and illustrates the remaining state of crystal defects according to Comparative example 2, in which (a) and (b) are cross-sectional views illustrating the state of the crystal defects in the collector layer and the separation layer when the substrate temperature during ion implantation is 400° C. and (c) and (d) are cross-sectional views illustrating the state of the crystal defects in the collector layer and the separation layer when the substrate temperature during ion implantation is 500° C.
Figure 12:
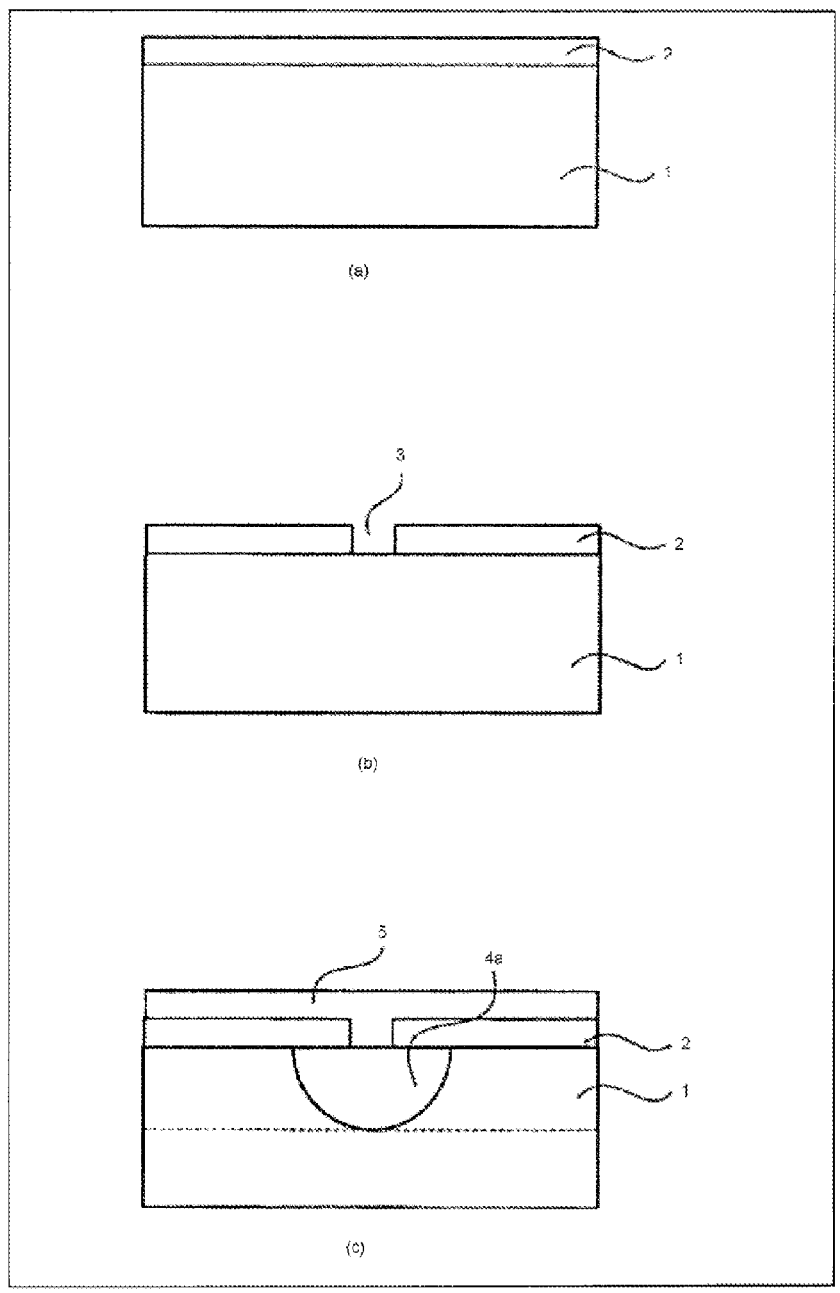
FIG. 12 is a cross-sectional view illustrating a main portion of the semiconductor substrate and illustrates a method of forming a separation layer using coating and diffusion according to the related art.
Figure 13:
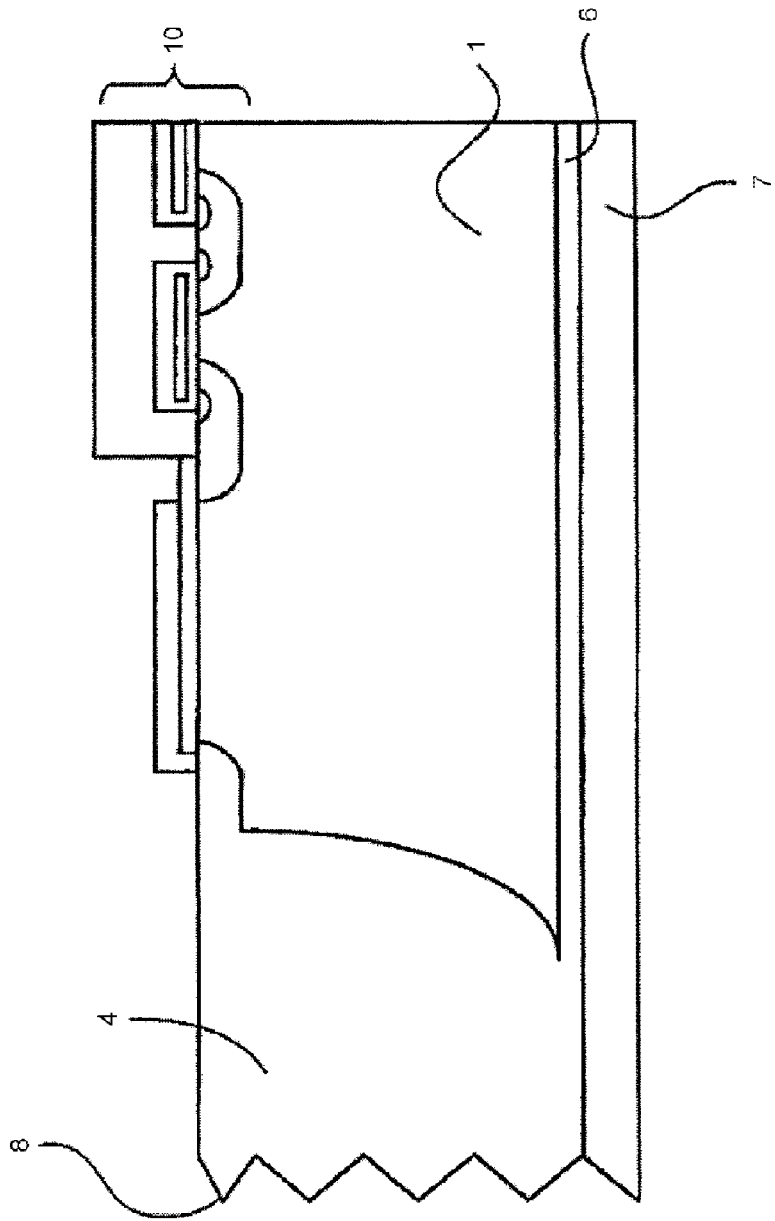
FIG. 13 is a cross-sectional view illustrating the vicinity of the end of a reverse blocking IGBT including a separation layer which is formed by coating and diffusion according to the related art.
Figure 15:
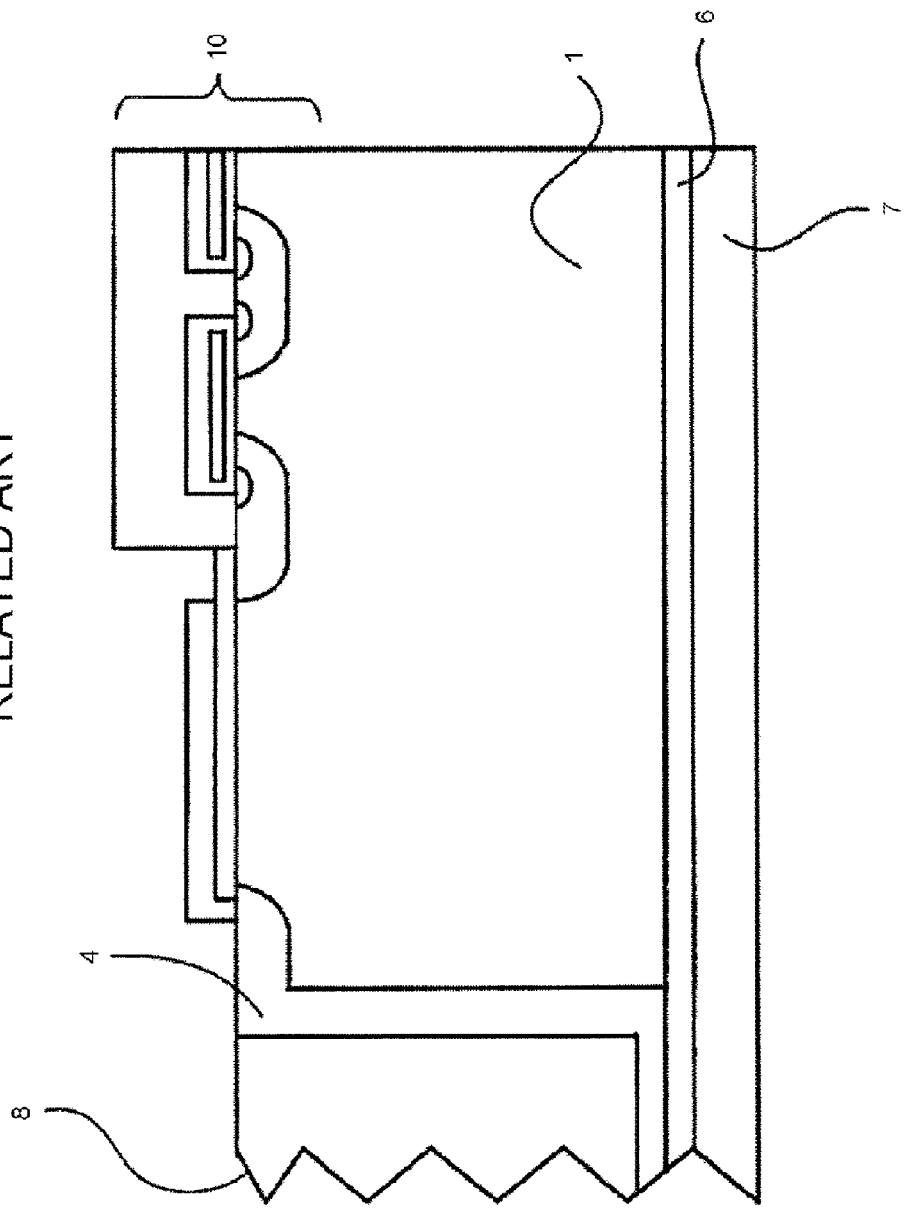
FIG. 15 is a cross-sectional view illustrating the vicinity of the end of a reverse blocking IGBT including a separation layer which is formed using a trench according to the related art.
Figure 16:
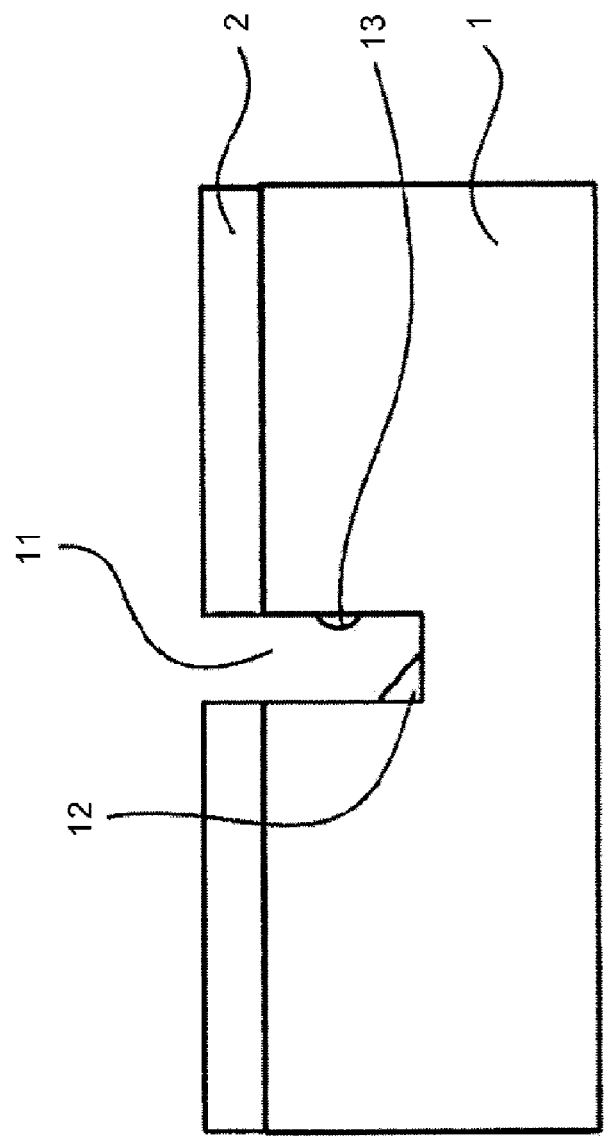
FIG. 16 is a cross-sectional view illustrating the vicinity of the end of the reverse blocking IGBT including the separation layer which is formed using the trench according to the related art and illustrates the problems of the reverse blocking IGBT.
Figure 17:
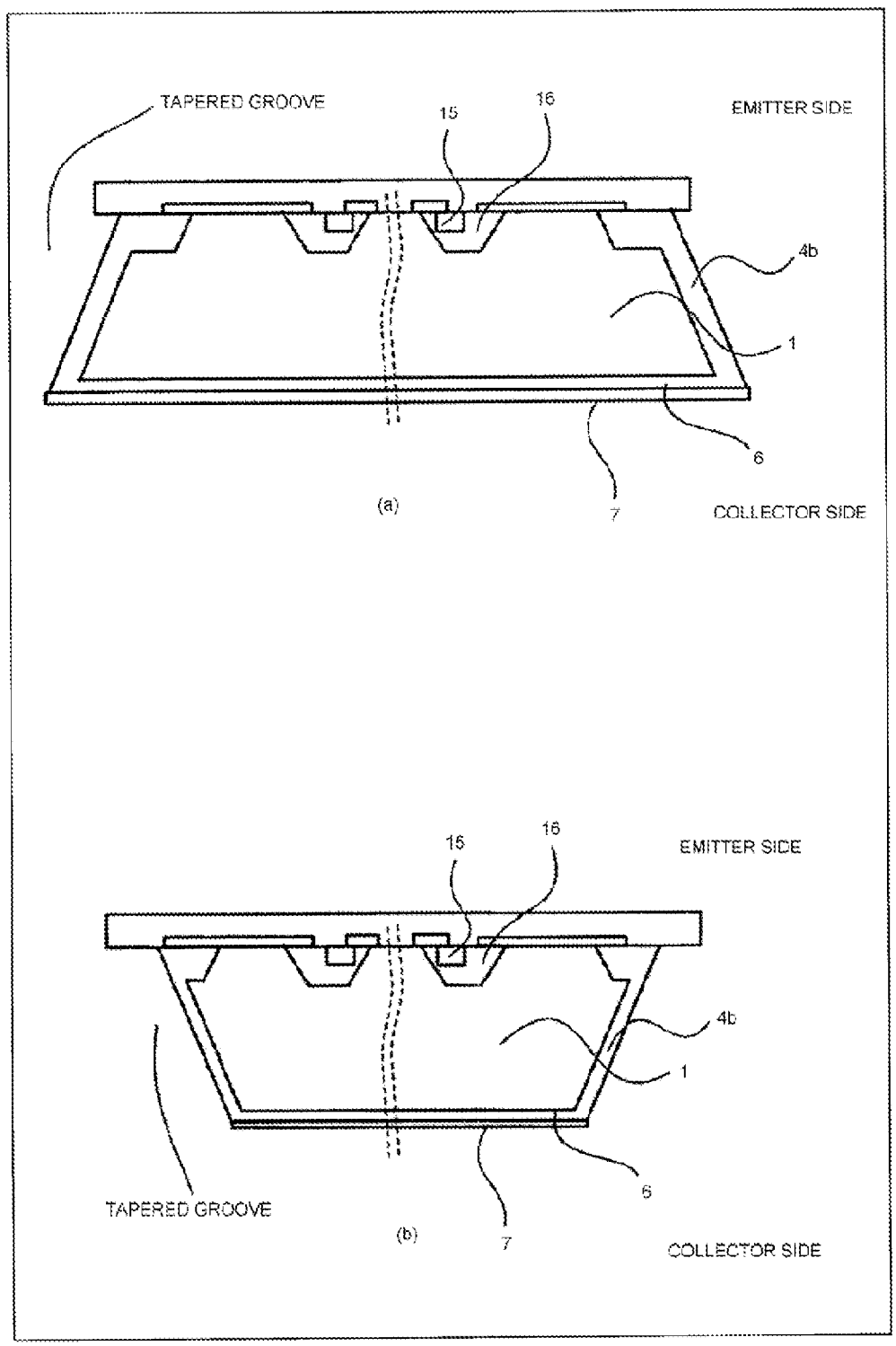
FIG. 17 is a cross-sectional view illustrating a reverse blocking IGBT including a separation layer which is formed on a tapered surface using anisotropic etching.

Therefore, in Comparative example 2, it is considered that the degree of activation is more than that in the related art and Comparative example 1. For the diffusion depth, since ion implantation is performed while the substrate is being heated, the diffusion effect of the collector layer and the separation layer is slightly more than that in the related art (FIG. 5) in which ion implantation is performed without heating. For the crystal defects in Comparative example 2 illustrated in FIG. 12, it is considered that heating during ion implantation contributes to reducing the crystal defects in a deep portion, as compared to FIG. 6 (the related art) and FIG. 11 (Comparative example 2).

In particular, FIGS. 11(a) and 11(c) illustrate a state in which there is no crystal defect in the collector layer (rear surface). In addition, a small number of defects remain in FIGS. 11(b) and 11(d) in Comparative example 2, as compared to the related art (FIG. 6(b)) and Comparative example 1 (FIGS. 9(b) and 9(d)). This is because the crystal defects in the range from the upper portion of the side surface having the separation layer provided thereon to the central portion thereof are recovered. It is considered that heating during ion implantation and furnace annealing are effective.

In addition, in Comparative example 2 (FIG. 7(c)), the reverse current (reverse leakage current) is less than in the related art and Comparative example 1 (FIG. 7(b)) in the laser annealing process illustrated in FIG. 7(a). The reason is that, since the recovery of the crystal defects caused by ion implantation for the side surface of the separation layer is effective, the leakage current is reduced when a reverse bias is applied.

Embodiment 1

Next, a reverse blocking IGBT according to Embodiment 1 of the invention will be described. Ion implantation is performed while a semiconductor substrate 1 is heated, in order to activate an ion implantation layer in a collector layer 6 and a separation layer 4. In addition, in order to perform the activation, a laser annealing process and a furnace annealing process are performed in this order, which is a characteristic portion of a method of manufacturing a reverse-blocking semiconductor element according to Embodiment 1.

FIG. 2 is a diagram illustrating the impurity concentration profiles of the collector layer and the separation layer according to Embodiment 1 of the invention. FIG. 2 illustrates the measurement result (the measurement result of spreading resistance) of the SR concentration profiles of the side surfaces of the collector layer ((a) and (c)) and the separation layer ((b) and (d)) when a boron dose is $1 \times 10^{15}$ $cm^{-2}$, an acceleration voltage is 150 keV, the temperature of the semiconductor substrate during ion implantation is 400° C. ((a)

and (b)) and 500° C. ((c) and (d)). The conditions of the laser annealing process are that the irradiation energy density of a YAG2ω laser (a wavelength 532 of nm and a pulse width of 100 ns) is 3.0 J/cm$^2$. The conditions of the furnace annealing process are that the temperature is 400° C. and the processing time is 5 hours. As described above, the laser annealing process was performed and then the furnace annealing process was performed under the above-mentioned conditions.

As can be seen from FIG. 2, the peak concentration of each of the rear surface (collector layer 6) and the separation layer 4 is higher than $1 \times 10^{19}$ cm$^{-3}$ and sufficient activation is obtained. The peak concentration is equal to that in Comparative example 2 (FIG. 10). A diffusion depth in a deep portion, particularly, in a portion with a depth of about 0.6 μm is more than that in the related art and Comparative examples 1 and 2 since the diffusion effect is added by the heating of the substrate during ion implantation and the use of the laser annealing process and the furnace annealing process.

In Embodiment 1, since there is no remaining crystal defect, the reverse current (reverse leakage current) is less than that in the related art illustrated in FIG. 7(a) and Comparative examples 1 and 2 (FIGS. 7(a) to 7(c)), as illustrated in FIG. 7(d) indicating the reverse leakage current according to Embodiment 1. This is because the crystal defects caused by ion implantation for the side surface of the separation layer are sufficiently recovered.

Embodiment 2

Next, a reverse blocking IGBT according to Embodiment 2 of the invention will be described. Ion implantation is performed while a semiconductor substrate 1 is heated at a temperature of 400° C. to 500° C., in order to activate an ion implantation layer in a collector layer 6 and a separation layer 4. In addition, in order to perform the activation, a furnace annealing process and a laser annealing process are performed in this order.

Figure 3:
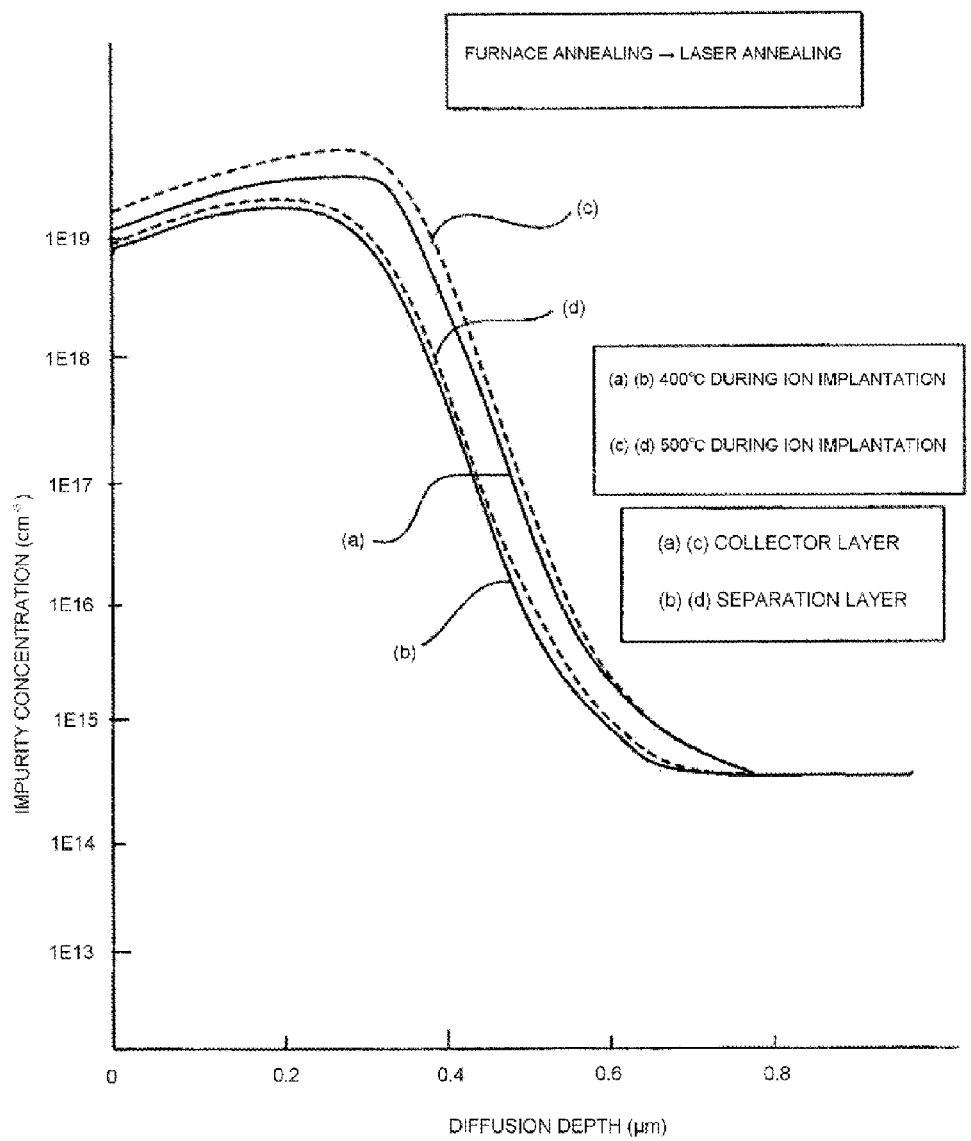
FIG. 3 is a diagram illustrating the impurity concentration profiles of a collector layer and a separation layer according to Embodiment 2 of the invention.

FIG. 3 is a diagram illustrating the impurity concentration profiles of the collector layer and the separation layer according to Embodiment 2 of the invention. FIG. 3 illustrates the measurement result (the measurement result of spreading resistance) of the SR concentration profiles of the side surfaces of the collector layer ((a) and (c)) and the separation layer ((b) and (d)) when a boron dose is $1 \times 10^{15}$ cm$^{-2}$, an acceleration voltage is 150 keV, the temperature of a semiconductor substrate during ion implantation is 400° C. ((a) and (b)) and 500° C. ((c) and (d)).

The conditions of the furnace annealing process are that the temperature is 400° C. and the processing time is 5 hours. The conditions of the laser annealing process are that the irradiation energy density of a YAG2ω laser (a wavelength 532 of nm and a pulse width of 100 ns) is 3.0 J/cm$^2$ during the laser annealing process. The furnace annealing process was performed and then the laser annealing process was performed under the above-mentioned conditions.

As can be seen from FIG. 3, the peak concentration of each of the collector layer and the separation layer is higher than $1 \times 10^{19}$ cm$^{-3}$ and sufficient activation is obtained. The peak concentration is equal to that in Comparative example 2 (FIG. 10) and Embodiment 1 (FIG. 2). A diffusion depth in a deep portion, particularly, in a portion with a depth of about 0.6 μm is more than that in the related art, Comparative examples 1 and 2, and Embodiment 1 since the diffusion effect obtained by the heating of the substrate during ion implantation and the use of the laser annealing process and the furnace annealing process is added.

The reason why the diffusion depth in Embodiment 2 is more than that in Embodiment 1 is as follows. In Embodiment 1, since the laser annealing process is performed first, the irradiated outermost surface is melted in a solid phase and a large amount of laser light is reflected, which makes it difficult for a dopant to be diffused in the depth direction.

As can be seen from Embodiments 1 and 2, the structure in which furnace annealing is performed to deeply inject a dopant using low-temperature diffusion and then the laser annealing process is performed is effective in activating a deep layer. The reason why the position with peak concentration is deeper than that in Embodiment 1 is that, since the furnace annealing process is performed first, diffusion is likely to occur and a box profile is likely to be obtained in a solid-phase molten state by laser irradiation.

In Embodiments 1 and 2, there is no crystal defect in the collector layer and the separation layer. As a result, the reverse leakage current (FIG. 7(e)) in Embodiment 2 is less than the reverse current (reverse leakage current) in the related art illustrated in FIG. 7(a), Comparative examples 1 and 2, and Embodiment 1 (FIGS. 7(b) to 7(d)). The result proves that the crystal defects caused by ion implantation for the side surface of the separation layer are sufficiently recovered in Embodiment 2.

In this embodiment, the n-type reverse blocking IGBT in which boron ions are diffused in the separation layer has been described. As the impurity ion, aluminum may be used instead of boron. In addition, in the case of a p-type reverse blocking IGBT, phosphorus ions may be used as a dopant for the separation layer.

In the above-described Embodiments 1 and 2, in the laser annealing process used in the annealing process, the YAG2ω laser is used as the all-solid-state laser. However, for example, a YLF2ω layer, a YVO4 (2ω) layer, a YAG3ω layer, a YLF3ω laser, and a YVO4 (3ω) may be used. An excimer laser, such as a XeCl (308 nm), a KrF, or a XeF layer, may be used instead of the all-solid-state laser. In addition, a semiconductor laser with a large penetration length to the silicon semiconductor substrate may be used, which is effective in recovering the defects of a deep implantation layer.

Figure 18:
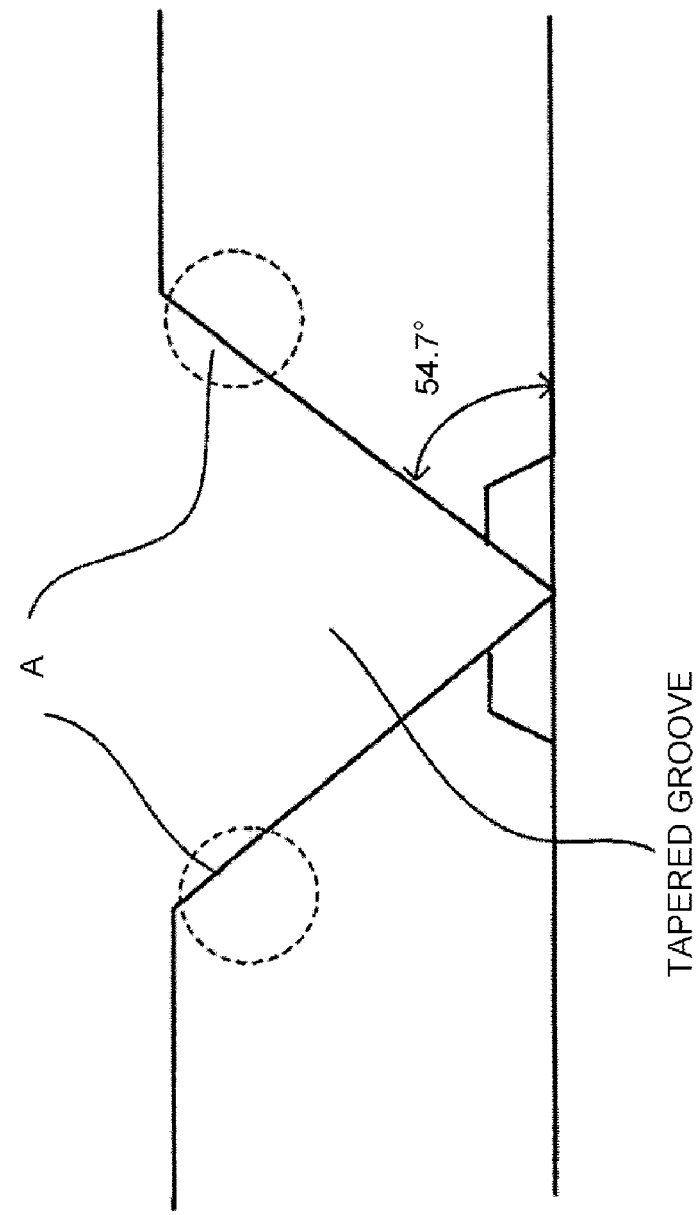
FIG. 18 is an enlarged cross-sectional view illustrating a region A of a tapered groove in which crystal defects are likely to remain on the side surface of a separation layer.

As described above, in the annealing method according to the related art which recovers the crystal defects caused by the ion implantation layer (separation layer) formed along the side surface formed by the tapered groove and activates the ion implantation layer, even when the laser annealing process is used, there is a region A in which defects are not sufficiently recovered, as illustrated in an enlarged cross-sectional view of FIG. 18 illustrating the vicinity of the tapered groove, which is an enlarged view illustrating the region represented by a circular dashed line in FIG. 4-1. Therefore, the leakage current increases and the reverse breakdown voltage is reduced.

In contrast, in the invention, during ion implantation, the semiconductor substrate is heated to increase the temperature of the semiconductor substrate. In this state, ion implantation is performed. In addition, the furnace annealing process and the laser annealing process are performed in this order or the reverse order at a temperature of 350° C. to 500° C. for 1 hour to 10 hours. In this way, it is possible to promote recrystallization (recovery of crystal defects) and achieve activation.

As a result, it is possible to reduce crystal defects occurring during ion implantation. Therefore, even in the method of manufacturing the reverse-blocking semiconductor element having the tapered groove with the structure including the region A in which defects are not sufficiently recovered by the laser annealing process, a reduction in the reverse breakdown voltage is prevented and yield is improved. Therefore, it is possible to reduce chip costs.

Industrial Applicability

As described above, the method of manufacturing the reverse-blocking semiconductor element according to the invention is useful for a reverse-blocking semiconductor element manufacturing method which makes an insulated gate bipolar transistor (hereinafter, abbreviated to an IGBT) in which the reliability of only forward voltage blocking capability is generally ensured have the reliability of reverse voltage blocking capability (hereinafter, abbreviated to reverse blocking capability) equal to the reliability of forward voltage blocking capability (hereinafter, abbreviated to forward blocking capability) and is particularly suitable for a method of manufacturing a reverse blocking IGBT.

REFERENCE SIGNS LIST 1 semiconductor substrate
2 oxide film mask
3 opening portion
4, 4b separation layer
4a diffusion layer
5 boron source
6 p collector layer
7 collector electrode
8 scribe line
10 surface structure
11 trench
12 chemical residue
13 resist residue
15 n emitter region
16 p base region
20 crystal defect
21 gate insulating film
22 gate electrode
23 interlayer insulating film
24 emitter electrode

The invention claimed is:

1. A method of manufacturing a reverse-blocking semiconductor element, comprising:
a step of forming a main surface structure including a MOS gate structure on one main surface of a first-conduction-type semiconductor substrate;
a step of forming a second-conduction-type collector layer on another main surface; and
a step of forming a second-conduction-type separation layer, which connects the one main surface and the other main surface and is connected to the second-conduction-type collector layer on the other main surface, along a side surface of a tapered groove which is formed from the one main surface to the other main surface by etching in an outer circumference of the main surface structure,
wherein, in the step of forming the second-conduction-type collector layer and the step of forming the second-conduction-type separation layer, second-conduction-type impurity element ions are implanted into the semiconductor substrate while the semiconductor substrate is maintained at a temperature of 400° C. or 500° C. and a laser annealing process and a furnace annealing process at a temperature of 350° C. or 500° C. are performed to form each of the second-conduction-type collector layer and the second-conduction-type separation layer.

2. The method of manufacturing the reverse-blocking semiconductor element according to claim 1,
wherein, after the laser annealing process is performed, the furnace annealing process at a temperature of 350° C. or 500° C. is performed.

3. The method of manufacturing the reverse-blocking semiconductor element according to claim 2,
wherein the step of forming the second-conduction-type collector layer and the step of forming the second-conduction-type separation layer are performed at a same time.

4. The method of manufacturing the reverse-blocking semiconductor element according to claim 1,
wherein, after the furnace annealing process at a temperature of 350° C. or 500° C. is performed, the laser annealing process is performed.

5. The method of manufacturing the reverse-blocking semiconductor element according to claim 4,
wherein the step of forming the second-conduction-type collector layer and the step of forming the second-conduction-type separation layer are performed at a same time.

6. The method of manufacturing the reverse-blocking semiconductor element according to claim 1,
wherein the step of forming the second-conduction-type collector layer and the step of forming the second-conduction-type separation layer are performed at a same time.

7. The method of manufacturing the reverse-blocking semiconductor element according to claim 1,
wherein a retention time of the furnace annealing process at a temperature of 350° C. or 500° C. is from 1 hour to 10 hours.

8. A method, comprising:
forming a tapered portion in a semiconductor substrate, the tapered portion extending from a first surface of the semiconductor substrate to a second surface of the semiconductor substrate on an opposite side from the first surface; and
forming a separation layer on the tapered portion;
wherein forming the separation layer includes
performing ion implantation into the tapered portion; and
performing a combination of at least two different annealing processes on the semiconductor substrate.

9. The method of claim 8, wherein the performing the combination of the at least two different annealing processes includes performing a laser annealing process and a furnace annealing process.

10. The method of claim 8, wherein the performing the combination of the at least two different annealing processes includes performing a laser annealing process followed by a furnace annealing process.

11. The method of claim 8, wherein the performing the combination of the at least two different annealing processes includes performing a furnace annealing process followed by a laser annealing process.

12. The method of claim 8, further comprising:
forming a collector layer on the second surface.

13. The method claim 8, further comprising:
forming a collector layer on the second surface at a same time as forming the separation layer.

* * * * *